(12) United States Patent
Pi et al.

(10) Patent No.: US 7,477,112 B1
(45) Date of Patent: Jan. 13, 2009

(54) STRUCTURE FOR THE MAIN OSCILLATOR OF A COUNTER-CONTROLLED DELAY LINE

(75) Inventors: Tao Pi, Sunnyvale, CA (US); Alireza S. Kaviani, San Jose, CA (US); Robert M. Ondris, Sunnyvale, CA (US)

(73) Assignee: XILINX, Inc., San Jose, CA (US)

( * ) Notice: Subject to any disclaimer, the term of this patent is extended or adjusted under 35 U.S.C. 154(b) by 76 days.

(21) Appl. No.: 11/505,696

(22) Filed: Aug. 16, 2006

(51) Int. Cl.
*H03B 27/00* (2006.01)

(52) U.S. Cl. .................. 331/57; 331/1 A; 331/36 C; 327/296

(58) Field of Classification Search .......... 331/57, 331/1 A, 36 C; 327/296
See application file for complete search history.

(56) References Cited

U.S. PATENT DOCUMENTS

| | | | |
|---|---|---|---|
| 6,134,191 A | 10/2000 | Alfke | |
| 6,445,232 B1 | 9/2002 | Logue et al. | |
| 6,559,727 B2 * | 5/2003 | Boerstler | 331/57 |
| 6,611,477 B1 | 8/2003 | Speyer et al. | |
| 6,812,799 B2 | 11/2004 | Kirsch | |
| 6,842,078 B2 * | 1/2005 | Manna et al. | 331/57 |
| 7,027,545 B2 | 4/2006 | Sander | |
| 7,157,951 B1 | 1/2007 | Morrison et al. | |
| 7,190,756 B1 | 3/2007 | Kaviani et al. | |
| 2003/0204743 A1 | 10/2003 | Devadas et al. | |

OTHER PUBLICATIONS

Xilinx, Inc.; "Virtex-II Platform FPGA Handbook"; published Dec. 6, 2000, pp. 161-183, v1.0, available from Xilinx, Inc., 2100 Logic Drive, San Jose, California 95124.
Xilinx, Inc., "Counter-controlled Delay Line", U.S Appl. No. 11/015,674, filed Dec. 17, 2004.
Xilinx, Inc., "Dual-edge Synchronized Data Sampler", U.S. Appl. No. 11/015,322, filed Dec. 17, 2004.

* cited by examiner

*Primary Examiner*—Arnold Kinkead
(74) *Attorney, Agent, or Firm*—William L. Paradice, III; John J. King

(57) ABSTRACT

A counter-controlled delay line includes a main oscillator for delaying edges of an input signal to generate a main clock signal. The main oscillator includes a plurality of gated delay elements connected in a ring. Each gated delay element includes a first control terminal to receive a corresponding load signal, and includes a second control terminal to receive a release signal. The release signal may simultaneously enable and disable state transitions in all delay elements, and the load signals may simultaneously drive an output of each delay element to any selected logic state.

17 Claims, 21 Drawing Sheets

STRUCTURE FOR THE MAIN OSCILLATOR OF A COUNTER-CONTROLLED DELAY LINE

FIELD OF THE INVENTION

The invention relates to delay lines, and more particularly, to a counter-controlled delay line.

BACKGROUND OF THE INVENTION

One of the critical challenges for circuit designers is managing timing of their designs. Precise control over timing and clock signals can enable higher performance and increase reliability. Controlling timing, however, is becoming increasingly difficult as circuits grow more complex and clock frequencies increase.

Common clock management circuits include phase-locked loops (PLLs) and delay-locked loops (DLLs). Both PLLs and DLLs may be used to perform tasks such as de-skewing a clock signal, shifting phase of a clock signal, and synthesizing clock frequencies. A DLL generally includes at least one delay line, such as a tap-controlled delay line, for delaying signals. Clock management circuits are used in a variety of integrated circuits to manipulate clock signals. One type of integrated circuit that often includes clock management resources including PLLs and/or DLLs is a programmable logic device (PLD).

A PLD is a well-known type of integrated circuit that can be programmed to perform specified user functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., RAM, multipliers, processors, transceivers).

The CLBs, IOBs, interconnect, and other logic blocks are typically programmed by loading a stream of configuration data (bitstream) into internal configuration memory cells that define how all of the blocks are configured. The configuration data can be read from memory (e.g., an external PROM) or written into the FPGA by an external device. The collective states of the individual memory cells then determine the function of the FPGA.

FPGAs may also include various clock management circuits, each of which may include one or more PLLs and DLLs, that may be configured to manipulate clock and other timing-critical signals. For example, the Xilinx Virtex®-II FPGA includes digital clock managers (DCMs), each of which includes at least one DLL, for a variety of functions including clock de-skewing, frequency synthesis, phase shifting, and EMI reduction. (The Xilinx Virtex-II FPGA DCM is described in detail at pages 161-183 of the "Virtex-II Platform FPGA Handbook", published December, 2000, available from Xilinx, Inc., 2100 Logic Drive, San Jose, Calif. 95124, which pages are incorporated herein by reference.)

FIG. 1 shows an example clock management circuit 100 that includes a delay line. Clock management circuit 100 may be a part of an integrated circuit 190. Clock management circuit 100 may include one or more decoders 104 and 106, a delay unit 110, and a trim unit 130. An example of a clock management circuit 100 is a DCM in an FPGA, and an example of delay unit 110 is a DLL in a DCM of an FPGA. Clock management circuit 100 takes an input clock CLKIN, applies a delay based on a multi-bit DLYSEL signal, and provides the delayed clock signal as an output clock CLKOUT. The multi-bit DLYSEL signal may be an encoded signal, and may be decoded by one or more decoders 104 and 106. Delay unit 110 includes a delay line 115 and a selector 117. In particular, delay line 115 within delay unit 110 is conventionally a tap-controlled delay line (TCD) that delays a signal by a number of taps indicated by the decoded DLYSEL signal. That is, delay line 115 may include a chain of delay taps that each add a predetermined amount of delay to the input signal. By varying the length of that chain, for example by using selector circuit 117, the delay applied to the input signal may be varied. Some of the bits of the DLYSEL signal may be decoded and used to control trim unit 130. Trim unit 130 may be used to fine-tune or trim the delayed signal from delay unit 110. Typically, each trim unit step is a fractional increment of the tap delay. Thus, delay provided by clock management circuit 100 may be adjusted at in two ways. As shown in FIG. 1, bits <15:3> of DLYSEL are used to set the delay adjustment of delay unit 110, and bits <2:0> are used to set the delay adjustment of trim unit 130.

One disadvantage of a tap-controlled delay line is the delay taps in of the tap-controlled delay line may be sensitive to environmental and operating conditions such as process variations, voltage, temperature, and noise. For example, some delay lines are controlled by adjusting an analog voltage, and noise in the voltage supplies may result in fluctuations in the delay provided by each tap. This can lead to jitter in the resulting clock signals, which generally decreases the performance of the design.

Another disadvantage of tap-controlled delay lines is that they can occupy a large amount of area. Each tap, which include one or more buffers or inverters, has a fixed area, and the number of taps needed depends on the maximum delay required. For example, in a clock management circuit, the maximum delay is dictated by the lowest frequency to be supported. Thus, the design of a tap-controlled delay line requires a tradeoff between layout area and the supported frequency range. In particular, the area occupied by a delay line increases approximately linearly with increases in frequency range (which may be defined as the ratio between the maximum and minimum frequencies supported).

A further disadvantage of tap-controlled delay lines is that they may introduce duty cycle distortion. For example, differences between the rise and fall times of the delay taps used in a delay line may cause the duty cycle of an input clock signal to vary. In cases where the input signal has high frequency, duty cycle distortion of a tap-controlled delay-line may cause the clock pulse to disappear entirely. Since some of the differences in rise and fall times are introduced by the unpredictable variations in the manufacturing process, it may be impossible to avoid this effect.

Accordingly, there is a need for a circuit that addresses these and other shortcomings of conventional tap-controlled delay lines.

SUMMARY OF THE INVENTION

A counter-controlled delay line for delaying an input signal is described. In an exemplary embodiment, an integrated circuit may include at least one edge delay unit for delaying edges of the input signal and providing delayed edge pulses. The edge delay unit may have a counter-controlled delay line including an oscillator to generate a main clock, the oscillator having an adjustable start point providing a medium grain delay adjustment to the input signal, and a counter for counting edges of the main clock, the counter providing a coarse grain delay adjustment to the input signal. In some embodiments, the edge delay unit may delay rising edges of the input signal and provide delayed rising edge pulses, and the integrated circuit may further include a second edge delay unit for delaying falling edges of the input signal and providing delayed falling edge pulses, and a merger circuit coupled to the edge delay units for merging the delayed rising edge pulses and the delayed falling edge pulses. In some embodiments, the integrated circuit may include a trim unit coupled to the edge delay unit, the trim unit providing a fine grain delay adjustment to the input signal.

An edge delay unit may include an oscillator for providing a main clock, the oscillator having a selectable starting point applying a medium grain delay adjustment to an input signal, a counter coupled to the oscillator for counting edges of the main clock, the counter applying a coarse grain delay adjustment to the input signal, and a sequential starter circuit coupled to the oscillator for detecting an edge of the input signal and selecting the starting point of the oscillator. In some embodiments, the edge delay unit may further include a comparator for comparing a count of the counter to a predetermined maximum count, and a sampler coupled to the comparator for providing a delayed edge pulse when the comparator indicates the count has reached the predetermined maximum count.

For some embodiments, the main ring oscillator includes a plurality of gated delay elements that are configured to receive a release signal and a plurality of independent load signals. During a reset operation, the release signal may be de-asserted to simultaneously disable all of the gated delay elements, and the output of each gated delay element may be simultaneously driven to any selected logic state in response to a corresponding one of the independent load signals. In this manner, the input signals to all delay elements are able to settle in a single gate delay during the reset operation, regardless of which delay element is selected as the oscillation start point. Thereafter, during normal operation, the release signal may be asserted to simultaneously enable all of the gated delay elements, and the load signals may be driven to logic states that allow the output of each gated delay element to be responsive to its input.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of integrated circuits and designs, including programmable devices such as programmable logic devices. The present invention has been found to be particularly applicable and beneficial for clock management systems, for example those that may be found in integrated circuits such as programmable devices. While the present invention is not so limited, an appreciation of the present invention is presented by way of specific examples.

The specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

Figure 1:
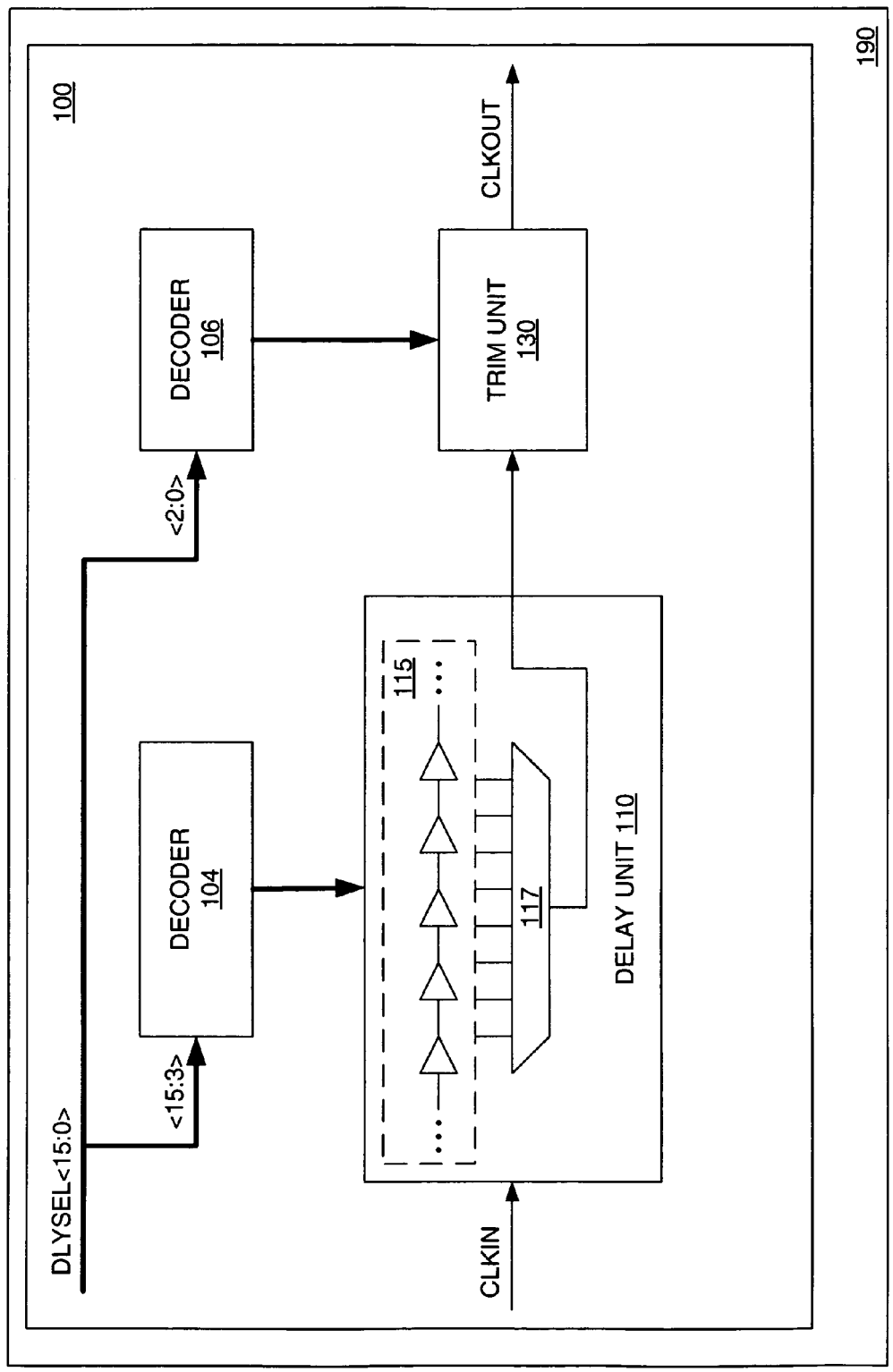
FIG. 1 shows a functional block diagram of a conventional clock management circuit.
Figure 2:
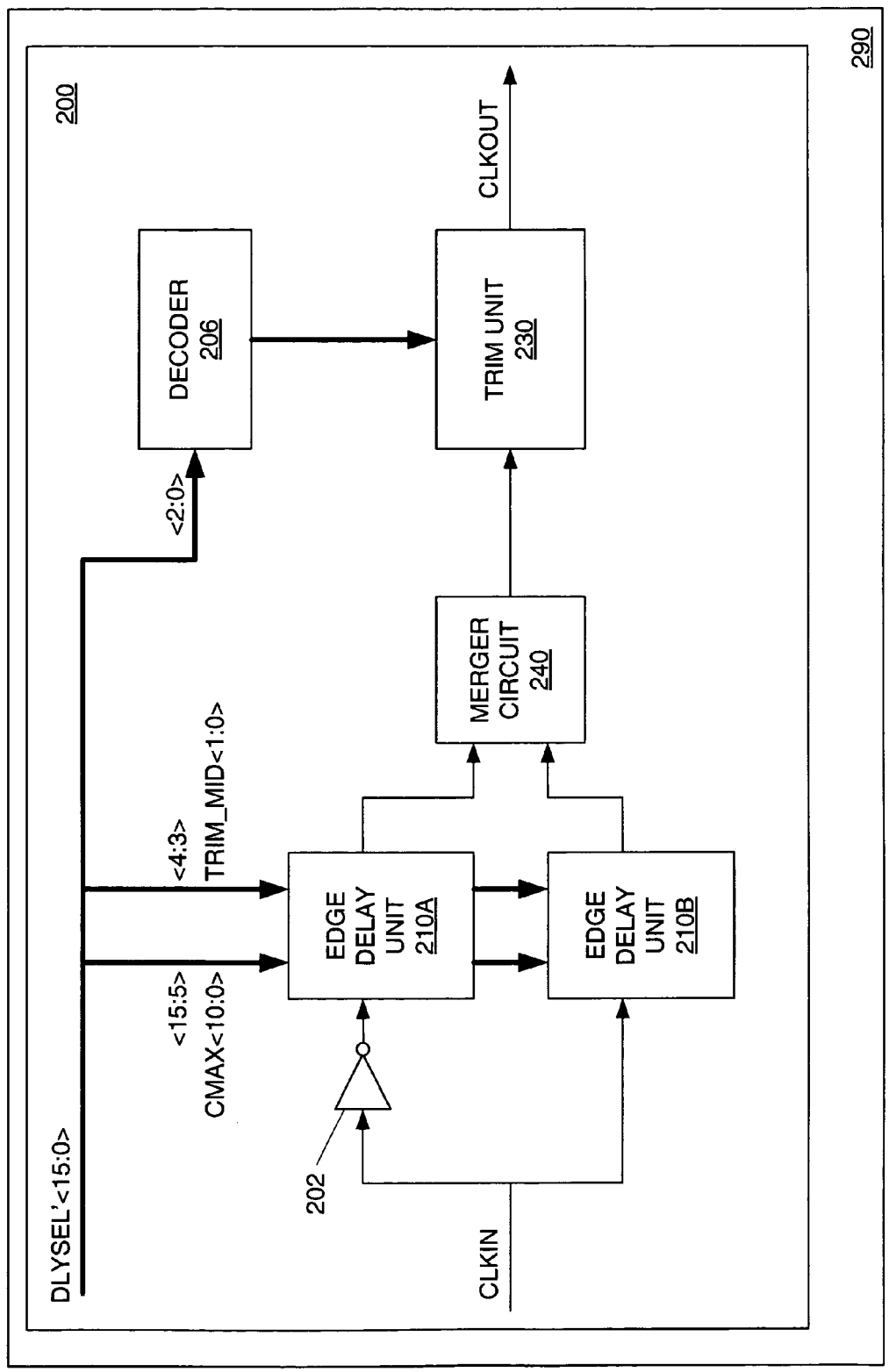
FIG. 2 shows a functional block diagram of a counter-controlled delay line in accordance with an embodiment of the present invention.

FIG. 2 shows a functional block diagram of a counter-controlled delay line 200 in accordance with an embodiment of the present invention. Counter-controlled delay line 200 may be part of an integrated circuit 290. In some embodiments, integrated circuit 290 may be a programmable logic device such as an FPGA. Counter-controlled delay line 200 receives an input clock CLKIN, delays CLKIN by an amount specified by a delay select signal DLYSEL', and provides a delayed output clock CLKOUT. Counter-controlled delay line 200 includes two edge delay units 210A and 210B, a merger circuit 240, and a trim unit 230, which may have an internal or external decoder 206. In some embodiments, trim unit 230 and decoder 206 may be the same as trim unit 130 and decoder 106, respectively, of FIG. 1. As shown in the example of FIG. 2, DLYSEL' is a 16 bit signal DLYSEL'<15:0> that is divided into three groups corresponding to three granularities for adjusting and applying delay to the input signal. Bits <15:5> of DLYSEL' are used for a coarse grain delay adjustment and are provided to edge delay units 210 as a maximum count signal CMAX<10:0>. Bits <4:3> of DLYSEL' are used for a medium or mid grain delay adjustment and are provided to edge delay units 210 as a mid trim signal TRIM_MID<1:0>. Bits <2:0> of DLYSEL' are used for a fine grain delay adjustment and are provided to decoder 206 for controlling trim unit 230. While the total number of delay select bits and the number of bits at each granularity shown in FIG. 2 may be preferable in some embodiments of the invention, other embodiments may have a different number of delay select bits organized, differently in the three granularities.

As will be described below in greater detail, each of delay units 210A and 210B delays the rising edges of its input signal and provides output edge pulses having rising edges delayed from the rising edges of CLKIN by an amount specified by the CMAX and TRIM-MID signals. Input clock CLKIN is provided to edge delay unit 210B to delay the rising edges of CLKIN. An inverted version of CLKIN is provided to edge delay unit 210A via inverter 202 to delay the falling edges of CLKIN. Edge pulses corresponding to delayed rising and falling edges are provided from edge delay units 210B and 210A, respectively, to merger circuit 240 for combining into a single merged delayed clock signal having delayed rising and falling edges. The merged delayed clock signal is then provided by merger circuit 240 to trim unit 230. Trim unit 230 provides a fine grain delay adjustment to the combined clock signal based on the decoded delay select bits and outputs the output clock CLKOUT. Thus, the delay adjustment applied to the input clock CLKIN may be controlled at three granularities to produce a delayed output clock CLKOUT. Coarse and mid grain delay may be provided by edge delay units 210, and fine grain delay may be provided by trim unit 230.

Figure 3:
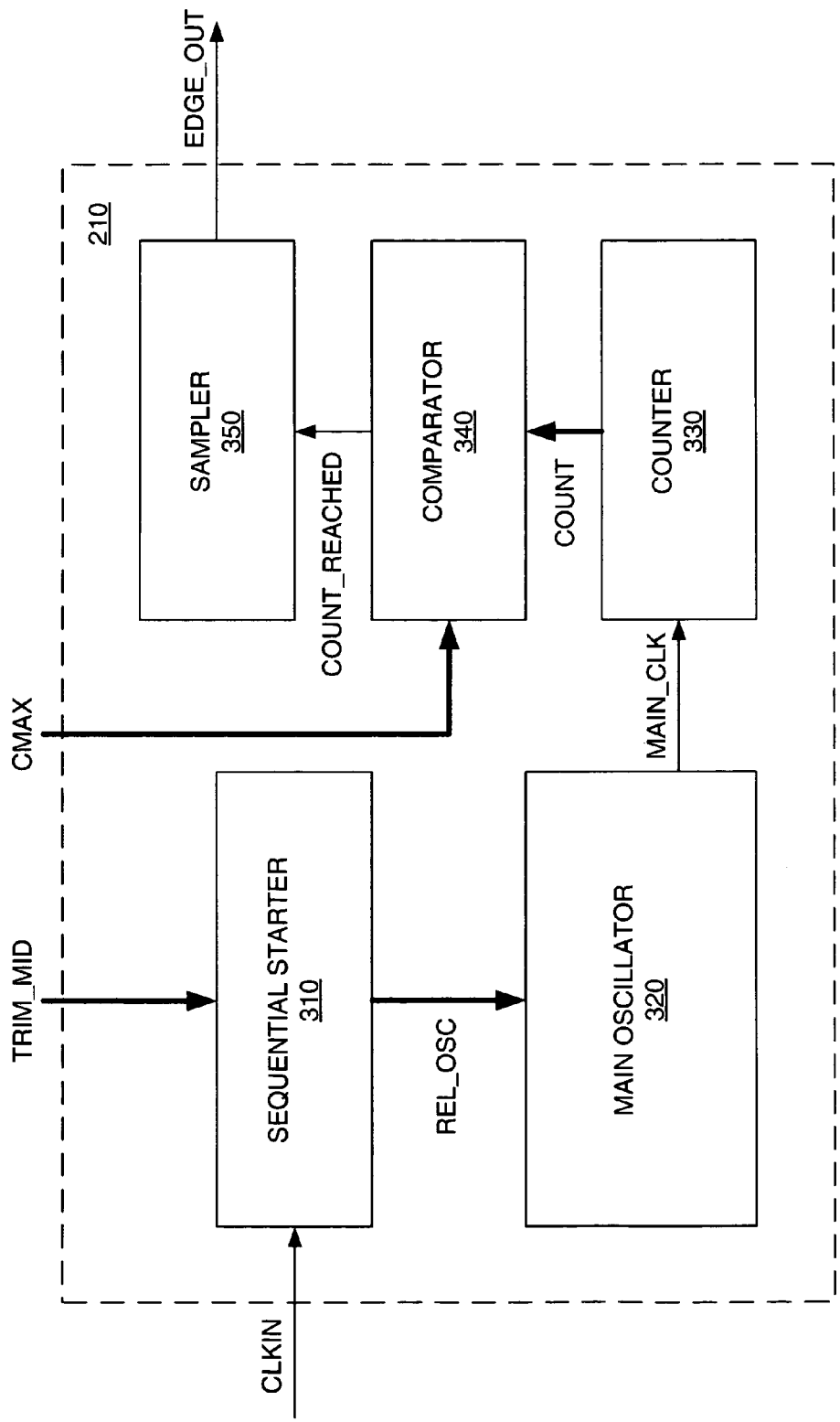
FIG. 3 shows a functional block diagram of an edge delay unit in accordance with an embodiment of the present invention.

FIG. 3 shows a functional block diagram of an edge delay unit 210 in accordance with an embodiment of the present invention. Edge delay unit 210 includes a sequential starter circuit 310, a main oscillator 320, a counter 330, a comparator 340, and a sampler 350. Sequential starter circuit 310 receives input clock CLKIN and mid grain trim signal TRIM_MID, and provides a release oscillator control signal REL_OSC to main oscillator 320. Sequential starter circuit 310 detects rising edges of CLKIN and releases main oscillator 320 to start oscillating when a rising edge is detected. Release oscillator control signal REL_OSC may be a multi-bit signal that provides decoded mid trim information to main oscillator 320. As will be explained below, this mid trim information is used to adjust the phase of main oscillator 320 and to provide a mid grain delay adjustment.

In response to the REL_OSC signal, main oscillator 320 begins to oscillate at a predetermined frequency to produce a clock signal MAIN_CLK. Clock signal MAIN_CLK is then used to drive counter 330. In some embodiments, counter 330 may be an edge counter that increments at each rising and falling edge of clock signal MAIN_CLK. In other embodiments, counter 330 may only count rising edges or falling edges. The output of counter 330, COUNT, is provided to comparator 340. Comparator 340 compares the current count to the maximum count CMAX value. When COUNT matches CMAX, comparator provides a COUNT_REACHED signal to sampler 350 to indicate that the desired maximum count CMAX has been reached. Thus, counter 330, in conjunction with main oscillator 320 and comparator 340, provides a coarse grain delay adjustment. For embodiments where counter 330 is an edge counter, the size of each coarse grain delay step is equal to half the period of oscillation of clock signal MAIN_CLK from main oscillator 320. That is, counter 330 increments for every half-cycle of MAIN_CLK until CMAX is reached, thereby providing a total coarse delay that is equal to CMAX multiplied by one-half the period of oscillation of main oscillator 320.

Once counter 330 has counted CMAX edges of MAIN_CLK, comparator 340 asserts the COUNT_REACHED signal, which is sampled by sampler 350. When sampler 350 detects that comparator 340 has asserted COUNT_REACHED, it provides a rising edge for the EDGE_OUT output signal for edge unit 210. Not shown in FIG. 3 is a reset signal for resetting the components of edge unit 210 after sampler 350 detects an asserted COUNT_REACHED and provides a rising edge at EDGE_OUT. The reset signal may be used to reset one or more of sequential starter circuit 310, main oscillator 320, counter 330, comparator 340, and sampler 350 to a known default state in preparation for the next clock edge at input signal CLKIN. In some embodiments, the reset signal may be logically derived from the COUNT_REACHED signal. The reset signal may also be combined with an external reset signal.

Figure 4:
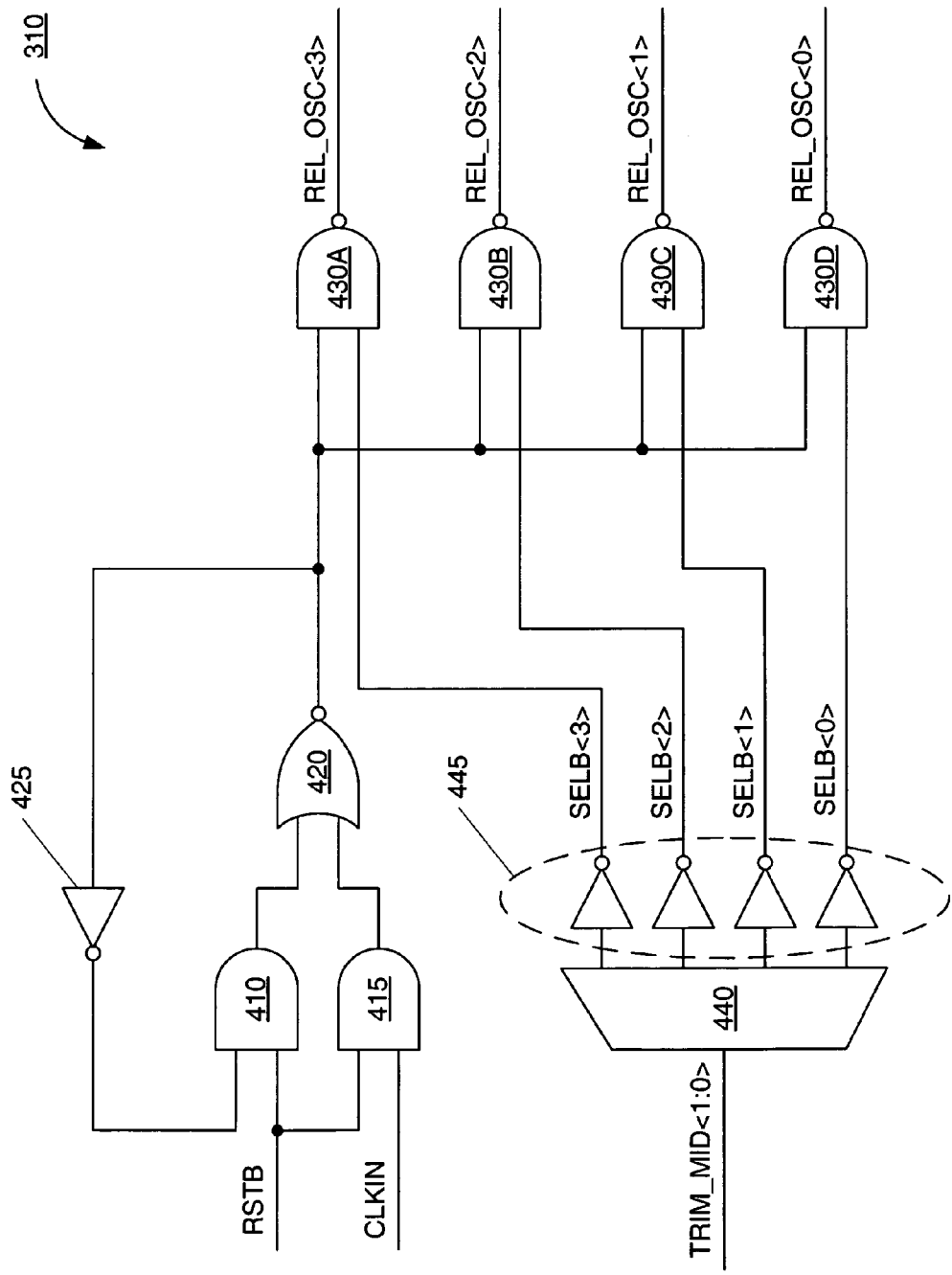
FIG. 4 shows an embodiment of a sequential starter circuit in accordance with the present invention.

FIG. 4 shows an embodiment of a sequential starter circuit 310 in accordance with the present invention. Sequential starter circuit 310 includes AND gates 410 and 415, NOR gate 420, NAND gates 430A-D, decoder 440, and inverters 425 and 445. AND gate 410 has a first input coupled to receive an active low reset signal RSTB and an output coupled to a first input of NOR gate 420. AND gate 415 has a first input coupled to receive RSTB, a second input coupled to receive input clock CLKIN, and an output coupled to a second input of NOR gate 420. The output of NOR gate 420 is coupled to the input of inverter 425, and to first inputs of each of NAND gates 430A-D. The output of inverter 425 is coupled to a second input of AND gate 410. Decoder 440 is coupled to receive the TRIM_MID signal and provide decoded and inverted outputs SELB<3:0> via inverters 445. Each of signals SELB<3:0> is coupled to a second input of NAND gates 430A-D, respectively. The outputs of NAND gates 430A-D are coupled to provide release oscillator control signals REL_OSC<3:0>, respectively.

The active low reset signal RSTB may first be asserted as a logic low to reset sequential starter circuit 310. The logic low RSTB signal causes logic low outputs for both AND gates 410 and 415. This in turn causes a logic high output for NOR gate 420. In the meantime, decoder 440 decodes the TRIM MID signal. For example, for a two bit TRIM_MID signal, decoder 440 asserts exactly one of four outputs, and de-asserts the other three outputs. Since the output of NOR gate 420 is a logic high, the outputs from decoder 440, via inverters 445, cause exactly one of NAND gates 430A-D to have a logic low output, and the remaining NAND gates to have a logic high output. That is, only one bit of REL_OSC<3:0> will be a zero and the remaining bits are ones. As will be described in greater detail below, this state of REL_OSC sets the starting point for the ring oscillator of main oscillator 320, and thereby sets the phase of clock signal MAIN_CLK.

To begin normal operation of sequential starter circuit 310, the reset signal RSTB is de-asserted to a logic high. In this state, sequential starter circuit 310 is ready to detect the next rising edge of CLKIN. When a rising edge is received at input clock CLKIN, output of AND gate 415 changes from a logic low to a logic high, causing the output of NOR gate 420 to change to a logic low. The logic low output of NOR gate 420 causes each of NAND gates 430A-D to provide logic high outputs. That is, all bits of REL_OSC are driven to a logic high state. As will be described below, this effectively releases main oscillator 320 to start oscillating. The feedback path through inverter 425 acts as a latch to preserve this state until sequential starter circuit 310 is reset.

Figure 5:
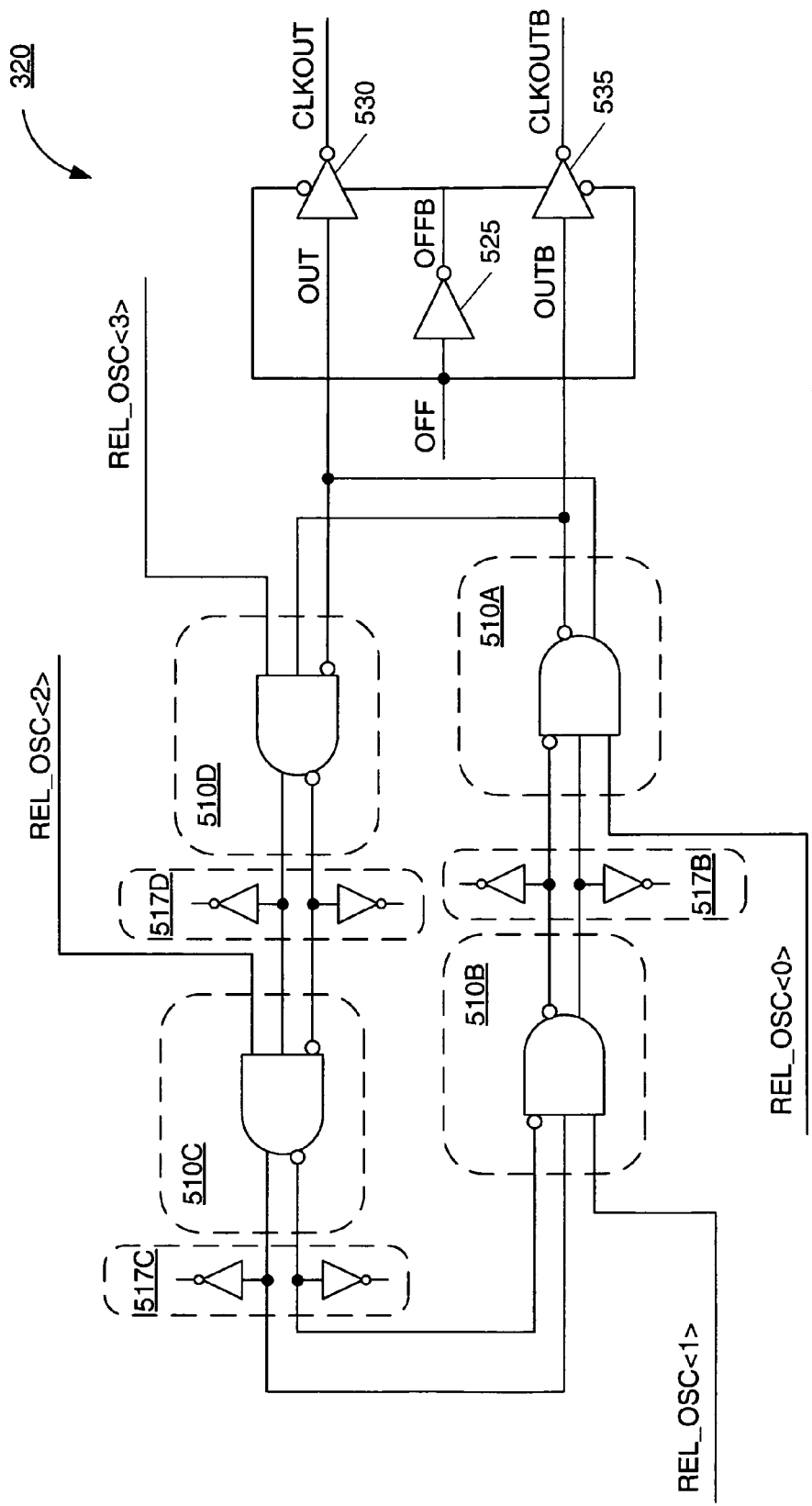
FIG. 5 shows an embodiment of an oscillator in accordance with the present invention.

FIG. 5 shows an embodiment of main oscillator 320 in accordance with the present invention. As shown, main oscillator 320 is a differential ring oscillator having four stages each including a gated delay element 510. Each gated delay element may be a two-input NAND gate having a first input coupled to the output of a preceding gated delay element, and a second input coupled to receive a gating signal, such as a release oscillator control signal REL_OSC. In some embodiments, gated delay elements 510A-510D are differential gated delay elements such as DCVSL NAND gates, as described below. For instance, each gated delay element may receive a differential input signal from a differential output of the preceding stage. The other input, providing the gating signal, may be single-ended, as shown in FIG. 5, or may be differential in other embodiments. The delay through any one of the gated delay elements 510A-510D is equal to one mid grain delay adjustment step. The differential output of gated delay element 510D drives the differential input of gated delay element 510C. The differential output of gated delay element 510C drives the differential input of gated delay element 510B. The differential output of gated delay element 510B drives the differential input of gated delay element 510A. Finally, the differential output of gated delay element 510A drives the differential input of gated delay element 510D with a reversed polarity, thereby providing the inversion necessary to form a ring oscillator. That is, the positive output of gated delay element 510A is coupled to the negative input of gated delay element 510D, and vice versa. The differential output of gated delay element 510A, OUT and OUTB, provides the differential clock output of main oscillator 320, CLKOUT and CLKOUTB, via gated buffers 530 and 535. Gated buffers 530 and 535, which may be inverting buffers in some embodiments, are gated by a control signal OFF and its complement OFFB, provided via inverter 525. Control signal OFF may be provided externally for disabling main oscillator 320. When control signal OFF is asserted, the outputs of gated buffers 530 and 535 may be driven to constant logic values. In some embodiments, gated buffer 530 provides a constant logic high and gated buffer 535 provides a constant logic low when control signal OFF is asserted. When control signal OFF is de-asserted, each of gated buffers 530 and 535 passes its input to its output.

Gated delay elements 510D-A are gated by release oscillator control signals REL_OSC<3:0>, respectively, as provided from sequential starter circuit 310. As previously described, when sequential starter circuit 310 is in its reset state and awaiting a positive clock edge at CLKIN, all but one of the bits of REL_OSC<3:0> are at a logic high while exactly one bit is a logic low. In this state, main oscillator 320 does not oscillate. When an edge is detected by sequential starter circuit 310, main oscillator 320 is released to start oscillating. More specifically, the first clock edge of the oscillation begins at the gated delay element corresponding to the position of the logic low bit of REL_OSC prior to releasing the oscillator. This allows for the output clock of main oscillator 320 to be provided with four different phases corresponding to the mid grain delay adjustment. For example, if in the reset state REL_OSC<1> is a logic low, and all other bits of REL_OSC are a logic high, then on the next rising edge of the input clock, REL_OSC<1> will transition from a logic low to a logic high. This causes the output of gated delay element 510B to transition from a logic low to a logic high, which then causes the output of gated delay element 510A to transition from a logic low to a logic high. The output of gated delay element 510A is provided as the output clock signal. Thus, a phase offset equal to the delay through two gated delay elements precedes the first transition of the output clock. Similarly, phase offsets equal to 1, 3, and 4 times the delay through a gated delay element are provided when one of REL_OSC<0>, <2>, and <3>, respectively, is the logic low bit in the reset state.

Output clock CLKOUT of main oscillator 320 oscillates at a frequency having a period equal to eight times the delay through each gated delay element. Main oscillator 320 may also include loads 517B-D coupled to the outputs of gated delay elements 510B-D, respectively. Loads 517B-D mimic the loading presented by the output buffers 530 and 535 at the output of gated delay element 510A. Note that in the illustrated embodiment, main oscillator has only four delay stages. Other numbers of stages are possible, depending on the organization of the DLYSEL' bits. However, it may be desirable to have a relatively small number of delay stages. Fewer delay stages allows for a more compact design that occupies less area than conventional tap-controlled delay lines. For instance, a typical tap-controlled delay line may have hundreds or thousands of taps. In further contrast to conventional tap-controlled delay lines, the number of taps required in the counter-controlled delay line is unrelated to the frequency range supported by the delay line. Thus only a small and fixed number of taps, or delay elements, are required to support an arbitrarily large frequency range. Decoupling capacitors may be added and coupled to the power supply to minimize the effects of noise in the power supply. Such decoupling capacitors would be impractical in conventional tap-controlled delay lines since they would require a large amount of area in order to be effective. In a counter-controlled delay line in accordance with an embodiment of the present invention, an effective amount of decoupling capacitance may be added without a significant area penalty since the number of taps is small. Preferably, gated delay elements 510A-D are differential gated delay elements, as shown, in order to make rise and fall times of the output clock CLKOUT (and CLKOUTB) as symmetric as possible.

Figure 6:
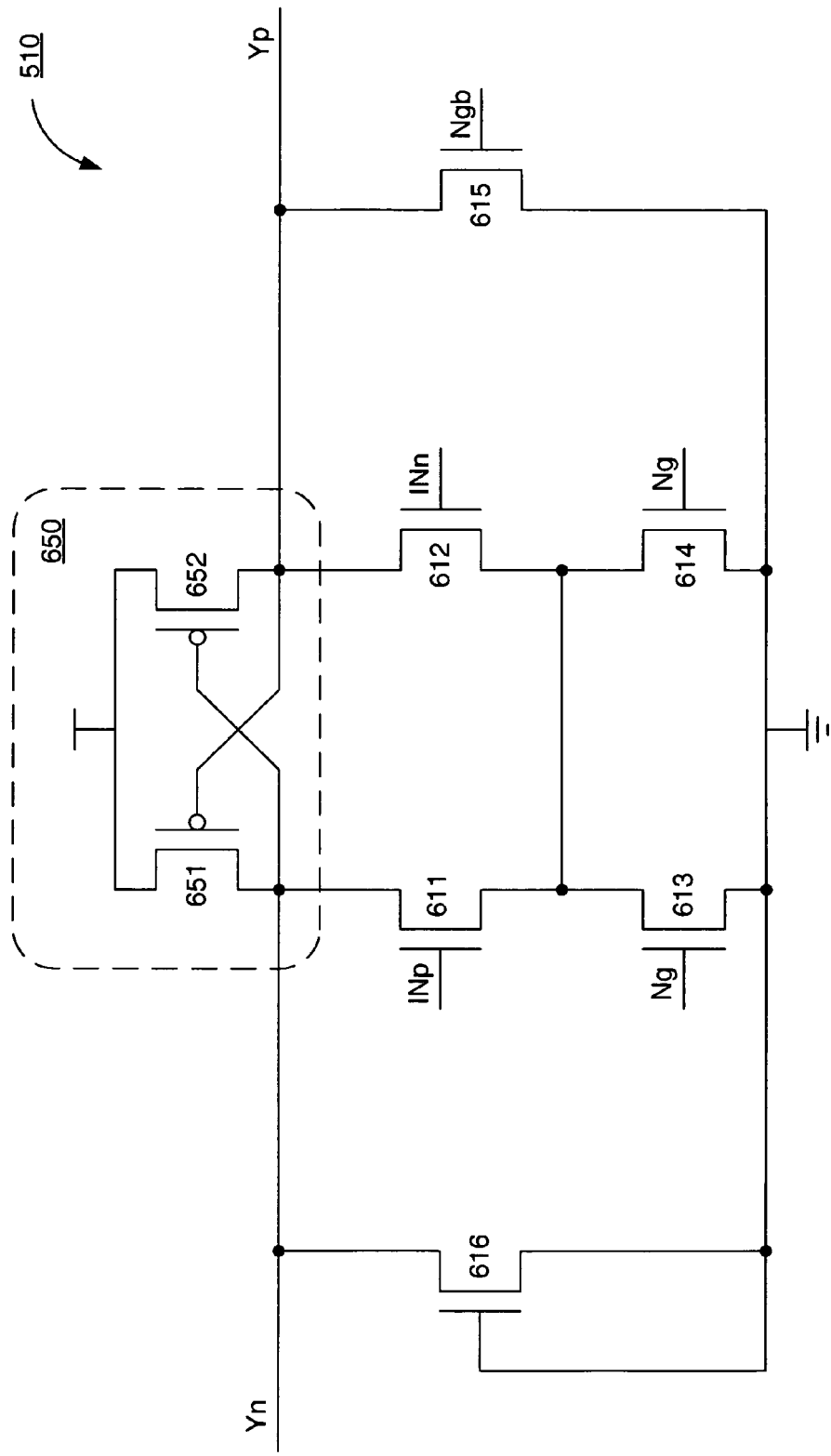
FIG. 6 shows an embodiment of a delay element in accordance with the present invention.

FIG. 6 shows an embodiment of a delay element 510 in accordance with the present invention. As shown, delay element 510 may be a differential NAND gate, such as a DCVSL NAND gate, having differential inputs IN and Ng, and providing a differential output Y. Differential input IN includes positive input INp and negative input INn. Differential input Ng includes positive input Ng and negative input Ngb, which may be provided by an inverter (not shown). Differential output Y includes positive output Yp and negative output Yn. As previously noted, the main oscillator may preferably include differential delay elements in order to obtain symmetric rise and fall times, thereby minimizing duty cycle distortion and other timing errors. Delay element 510, as shown in FIG. 6, includes a differential load 650, and NMOS transistors 611-616. Differential load 650 may include cross-coupled PMOS transistors 651 and 652 coupled to the differential output Y, as is typical of DCVSL circuits. NMOS transistors 611-615 are coupled to provide the NAND functionality with respect to the differential inputs IN and Ng. NMOS transistor 616 is coupled between the negative output terminal Yn and ground in order to provide symmetrical loading on the positive and negative output terminals.

Figure 7:
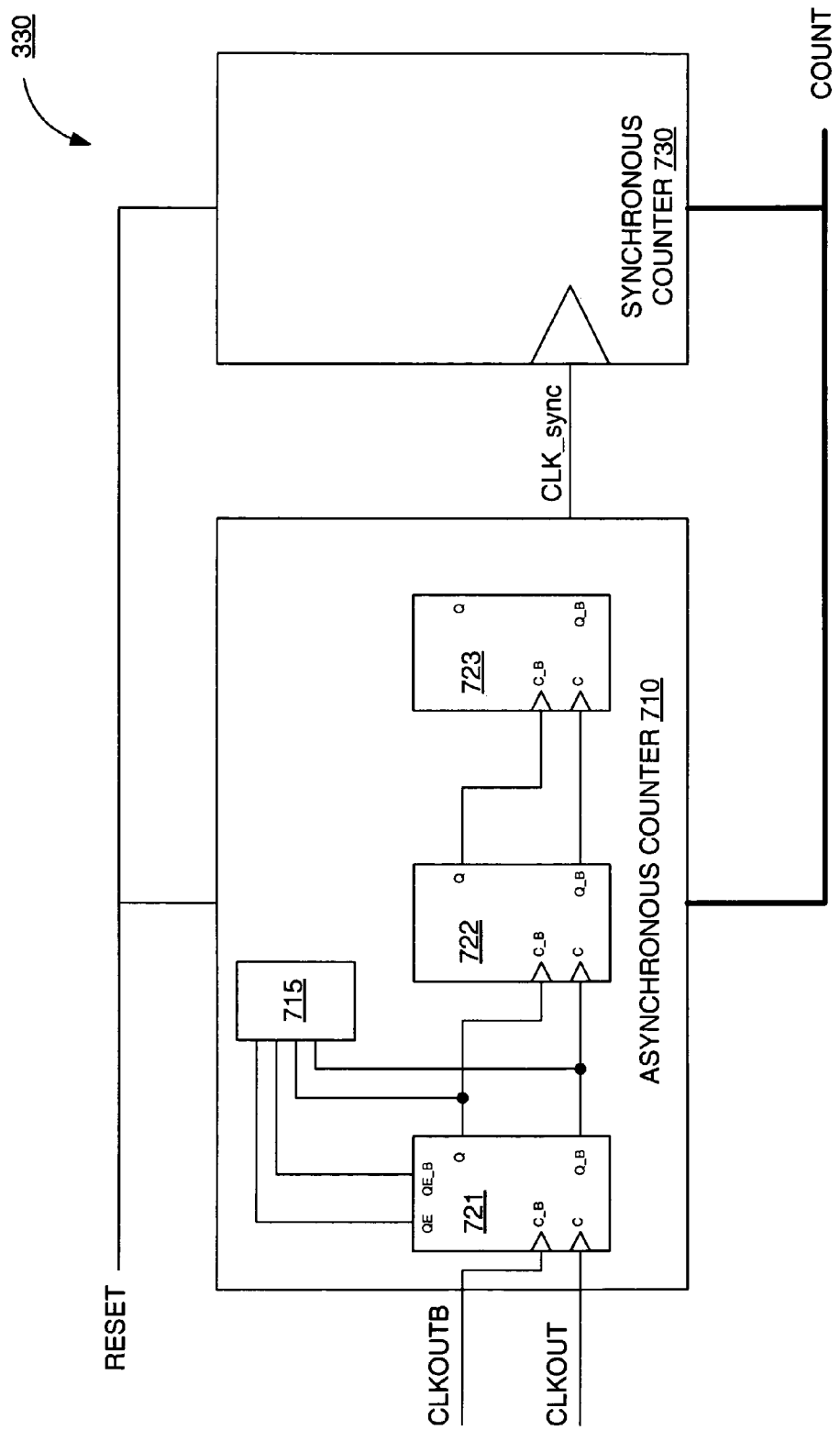
FIG. 7 shows an embodiment of a counter in accordance with the present invention.

FIG. 7 shows an embodiment of a counter 330 in accordance with the present invention. In general, counter 330 may be any type of counter that counts rising, falling, or both edges of the main oscillator clock. For embodiments of counter 330 that count both rising and falling edges, the frequency requirements on main oscillator 320 may be reduced. Preferably, counter 330 operates at high speed and limits noise. A fast counter allows the counter-controlled delay line to support higher frequency input clocks. Counter 330 may include an asynchronous counter 710 and a synchronous counter 730. Asynchronous counter 710 may be adapted for very high speed operation and may include an XOR gate 715 and one or more asynchronous counter stages 721-723. XOR gate 715 and asynchronous counter stages 721-723 may comprise differential logic, such as DCVSL (differential cascode voltage switch logic). One or more of the asynchronous counter stages 721-723 may further include an asynchronous level-mode-state machine. Synchronous counter 730 may be connected downstream from asynchronous counter 710, for example via a CLK-sync clock signal, and may be any well-known synchronous counter. Advantageously, an asynchronous counter may have desirable noise characteristics, and a synchronous counter may have low latency, especially at low frequencies. A hybrid counter having an asynchronous front end coupled to a synchronous tail end may take advantage of both of these properties. Other counters may also be used in other embodiments. For instance, counter 330 may be an asynchronous counter, a synchronous counter, or any combination thereof. Notably, frequency range of a tap-controlled delay line in accordance with an embodiment of the present invention may be extended at the low end simply by adding additional bits to counter 330. In particular, the frequency range supported may be doubled merely by adding one bit to the width of counter 330. Thus, a very large frequency range may be supported in a very small area.

Figure 8:
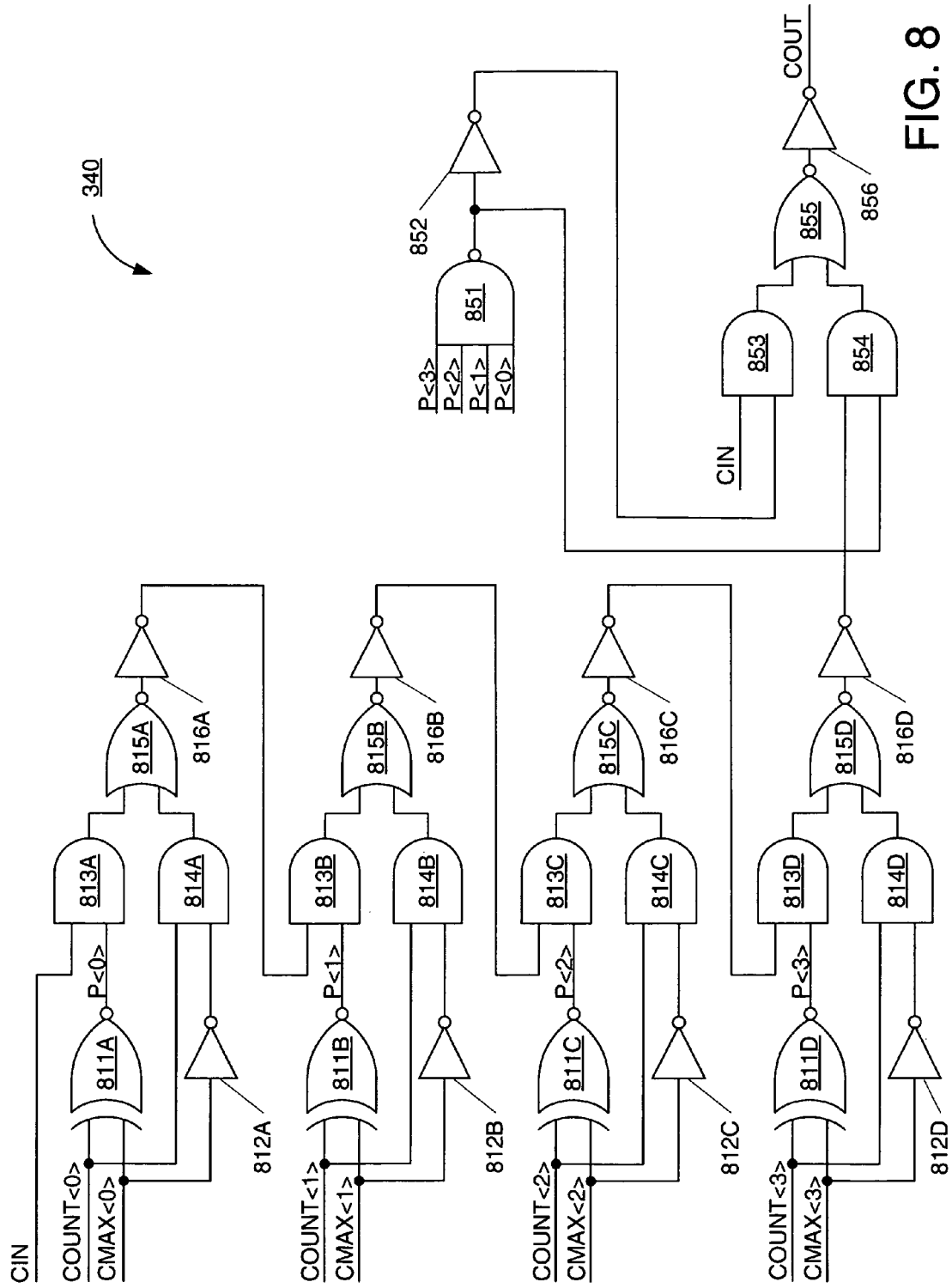
FIG. 8 shows an embodiment of a comparator in accordance with the present invention.

FIG. 8 shows an embodiment of comparator 340 in accordance with the present invention. Comparator 340 is coupled to receive the count signal COUNT from counter 330 and the maximum count signal CMAX and compare the two values. If COUNT matches CMAX, then comparator 340 asserts the COUT output signal. FIG. 8 shows a 4-bit comparator 340 that includes: XOR gates 811A-D; inverters 812A-D, 816A-D, 852, and 856; AND gates 813A-D, 814A-D, 853, and 854; NOR gates 815A-D and 855; and NAND gate 851. Comparator 340 receives a 4-bit COUNT<3:0> from counter 330 and a 4-bit CMAX<3:0> signal derived from the delay select DLYSEL' input. Comparator 340 also receives a carry input CIN and produces a carry output COUT. Two or more comparators similar to comparator 340 may be chained together to form wider comparators by coupling the carry out bit from one comparator to the carry in bit of the subsequent comparator. Comparator 340 may include carry skip logic, such as NAND gate 851 and AND gate 853, for optimized performance. Other comparator circuits are well-known to those of ordinary skill in the art.

Figure 9:
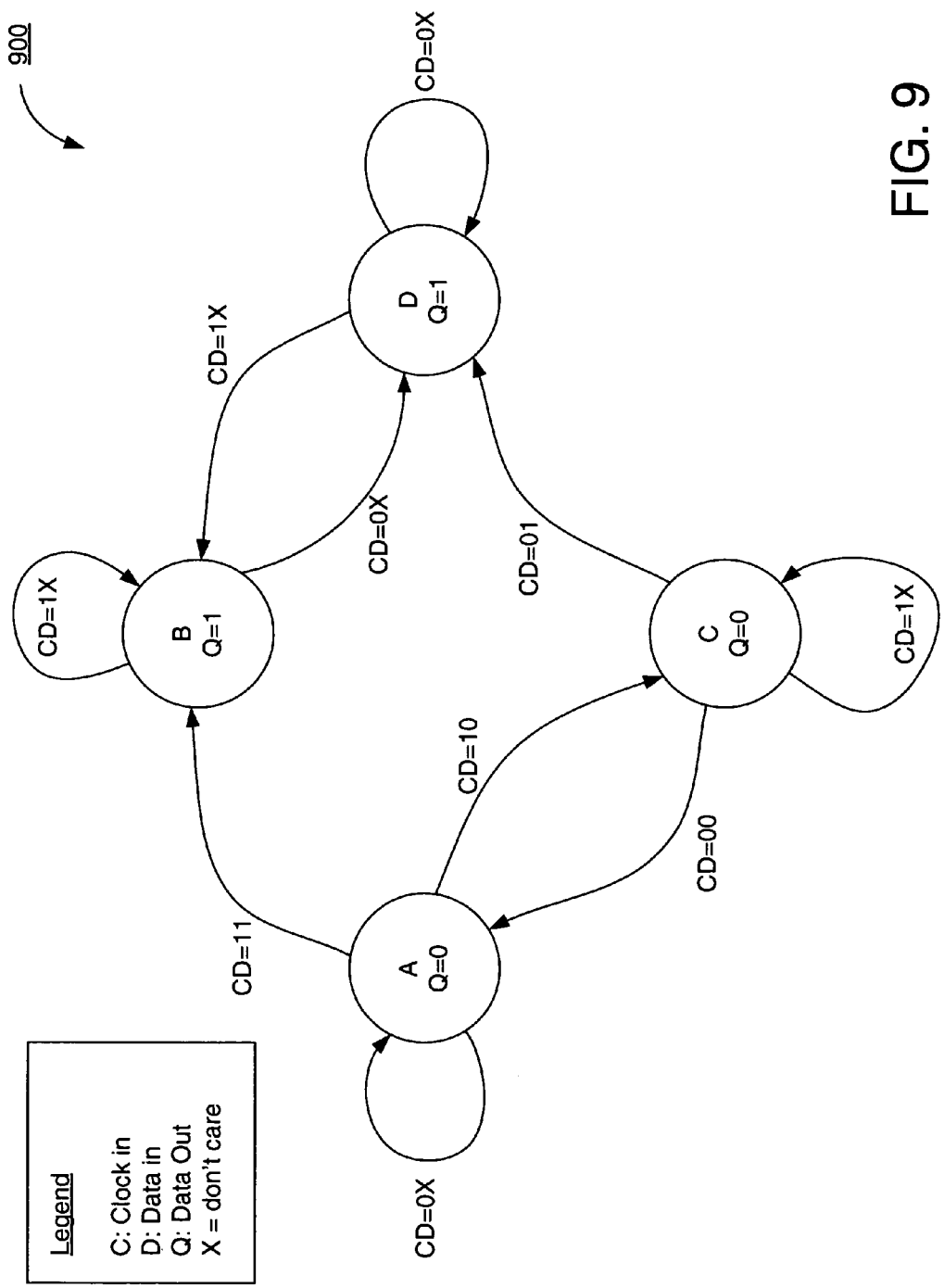
FIG. 9 shows a state diagram of a sampler in accordance with an embodiment of the present invention.

FIG. 9 shows a state diagram 900 of sampler 350 in accordance with an embodiment of the present invention. In general, for embodiments having a counter that counts both rising and falling edges, sampler 350 may be any dual-edge sampler, such as a DDR (double data rate) flip-flop. Preferably, the dual-edge sampler has symmetric clock to output propagation delays for rising and falling edges, and has a minimal setup time. Sampler 350 may be a dual-edge sampler that is implemented as an asynchronous level-mode state machine with input signals C and D corresponding to clock and data input signals, respectively, and providing an output signal Q having the states shown in FIG. 9. The clock input signal C may be the main oscillator signal MAIN-CLK, the data input signal D may be the COUNT_REACHED or COUT output signal from the comparator, and the output signal Q may be the EDGE_OUT output signal of the edge delay unit indicating a delayed edge. In some embodiments, the state machine describing sampler 350 may be implemented using differential logic, such as DCVSL. Other straightforward state machine implementations are also possible. As shown, the state machine is optimized for application in an edge delay unit and includes four states. State A corresponds to a state where the output signal Q is a logic low (indicating that the predetermined maximum count value has not yet been reached), and the sampler is waiting for a transition from logic low to logic high (e.g., a rising edge) at clock input C to trigger a state change. State B corresponds to a state where the output signal Q is a logic high (indicating that the predetermined maximum count value has been reached), and the sampler is waiting for a transition from logic high to logic low (e.g., a falling edge) at clock input C. State C corresponds to a state where the output signal Q is a logic low, and the sampler is waiting for a transition from logic high to logic low at clock input C. State D corresponds to a state where the output signal Q is a logic high, and the sampler is waiting for a transition from logic low to logic high at clock input C. Upon detection of the appropriate transition at clock input C in either state A or state C, sampler 350 latches the data input D by moving to one of state B and state D.

Sampler 350 may further include a reset input signal (not shown) for resetting the state machine. In some embodiments, the reset signal may be an asynchronous reset that forces sampler 350 to a reset state, such as state A or state C, when the reset signal is asserted. For instance, the reset signal may reset state machine 350 to one of state A and state C (both corresponding to a logic low output signal Q) depending on the logic level of clock input signal C. Thus, sampler 350 may be reset to the appropriate state such that it will be ready for the next clock edge when the reset signal is de-asserted or released. As shown in FIG. 9, sampler 350 may be optimized for use in detecting an asserted COUNT_REACHED signal. In particular, once sampler 350 latches a logic high data input, indicating that the desired count has been reached, any other changes in the data input signal are irrelevant and may be safely ignored. That is, sampler 350 may stop sampling once a logic high COUNT_REACHED signal has been detected. Thus, the transitions for exiting states B and D, where the Q output signal is a logic high, are not needed, so long as a reset signal is available for resetting the sampler (e.g., to one of states A or C). For example, the sampler may be reset when the counter is reset, and the reset signal may be derived from one of the COUNT_REACHED and EDGE_OUT signals. This optimization may result in a more efficient circuit that may occupy less area. In some embodiments, sampler 350 may additionally provide level shifting functionality to shift input signals having a first voltage range to an output signal having a different voltage range. This would allow the oscillator, counter and comparator to operate at a different voltage, powered by a different power supply, from other portions of the integrated circuit.

Figure 10:
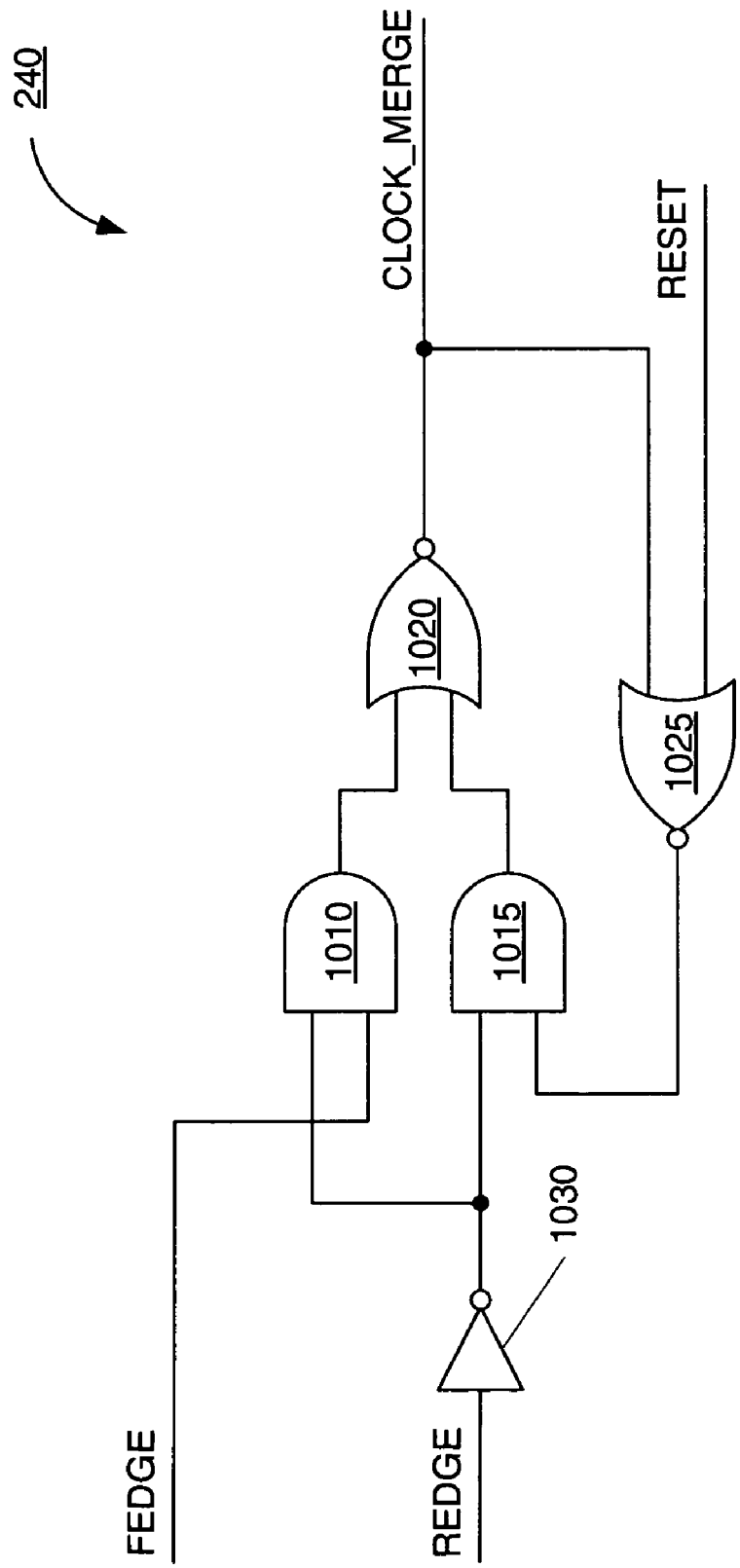
FIG. 10 shows an embodiment of a merger circuit in accordance with the present invention.

FIG. 10 shows an embodiment of a merger circuit 240 in accordance with the present invention. Merger circuit 240 receives a rising edge pulse signal REDGE, corresponding to a delayed rising edge of input clock CLKIN, and a falling edge pulse signal FEDGE, corresponding to a delayed falling edge of input clock CLKIN, and provides a merged output clock signal CLOCK_MERGE. Merger circuit may also receive a reset signal RESET for resetting the circuit to a known state. Merger circuit includes AND gates 1010 and 1015, NOR gates 1020 and 1025, and an inverter 1030. As can be seen, merger circuit 240 generates a rising edge in merged output clock signal CLOCK_MERGE for each pulse of REDGE, and a falling edge for each pulse of FEDGE.

Figure 11:
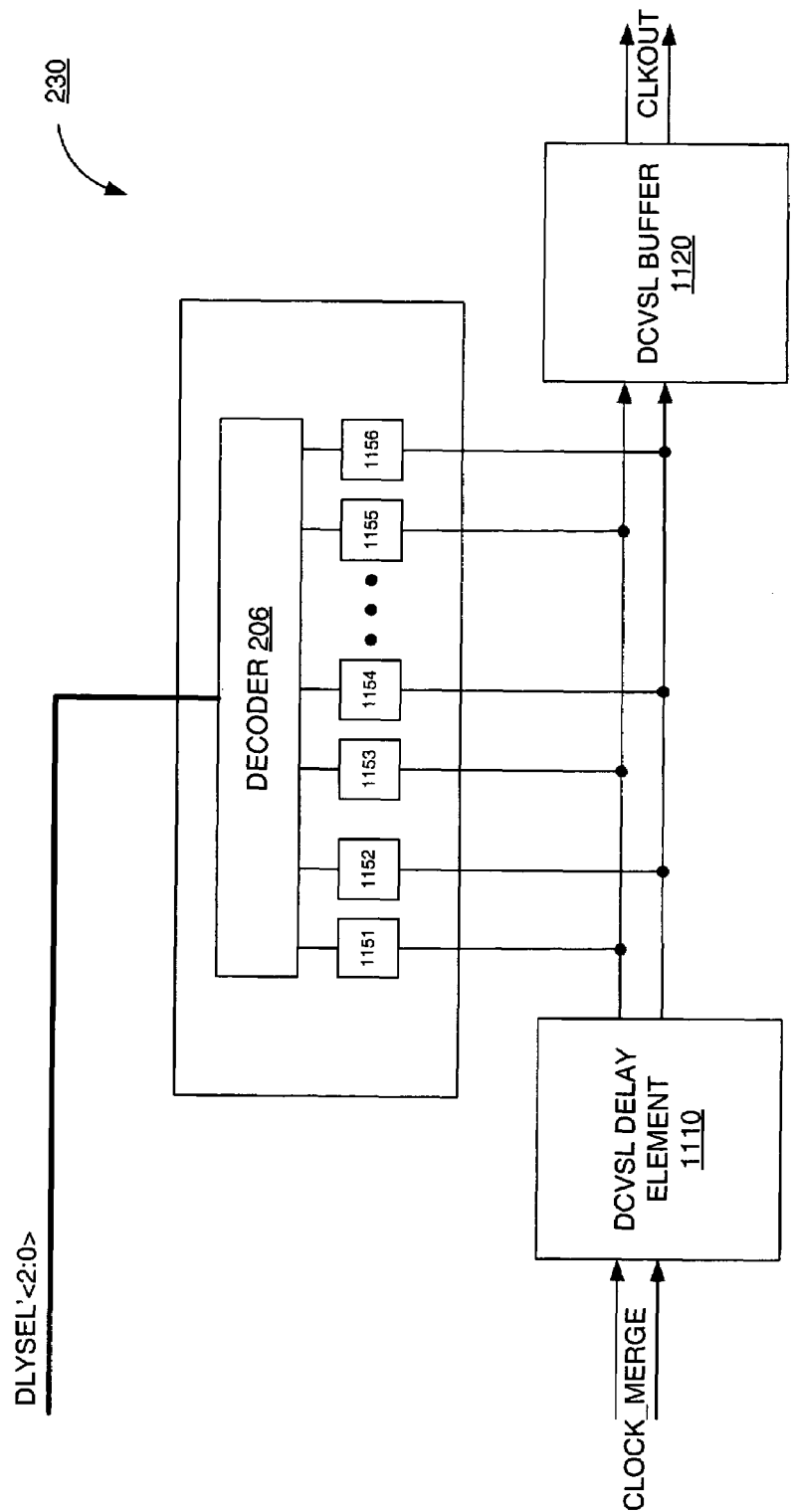
FIG. 11 shows an embodiment of a trim unit in accordance with the present invention.

FIG. 11 shows an embodiment of a trim unit 230 in accordance with the present invention. Trim unit 230 receives the merged clock CLOCK_MERGE from merger circuit 240 as input, applies a trim delay adjustment based on at least a portion of the DLYSEL' signal, and provides the final output clock CLKOUT. The trim delay adjustment provided by trim unit 230 corresponds to the fine grain delay adjustment. The input clock CLOCK_MERGE is delayed by a number of trim unit delay steps corresponding to the portion of the DLYSEL' signal provided to trim unit 230, for example DLYSEL'<2:0>. As shown in FIG. 11, trim unit 230 includes an input buffer 1110, an output buffer 1120, decoder 206, and capacitive loading elements 1151-1156. In some embodiments, trim unit 230 may be differential, and thus buffers 1110 and 1120 may be differential buffers such as DCVSL buffers. In some embodiments, at least one of buffer 1110 and 1120 may be implemented as a delay element similar to delay element 510.

Decoder 206 decodes the DLYSEL'<2:0> signal and selectively enables capacitive loads 1151-1156 based on the DLY-SEL' signal. Each additional capacitive load (or pair of capacitive loads for differential implementations) that is enabled increases the delay provided by trim unit 230 by a trim unit delay step. In some embodiments, the capacitive loads 1151-1156 are created by a large source diffusion area of one or more transistors. Using source diffusion as a capacitive load may minimize mismatches over process variations. Other trim units, such as ones using logic gates having varying sizes, are well-known in the art.

Figure 12:
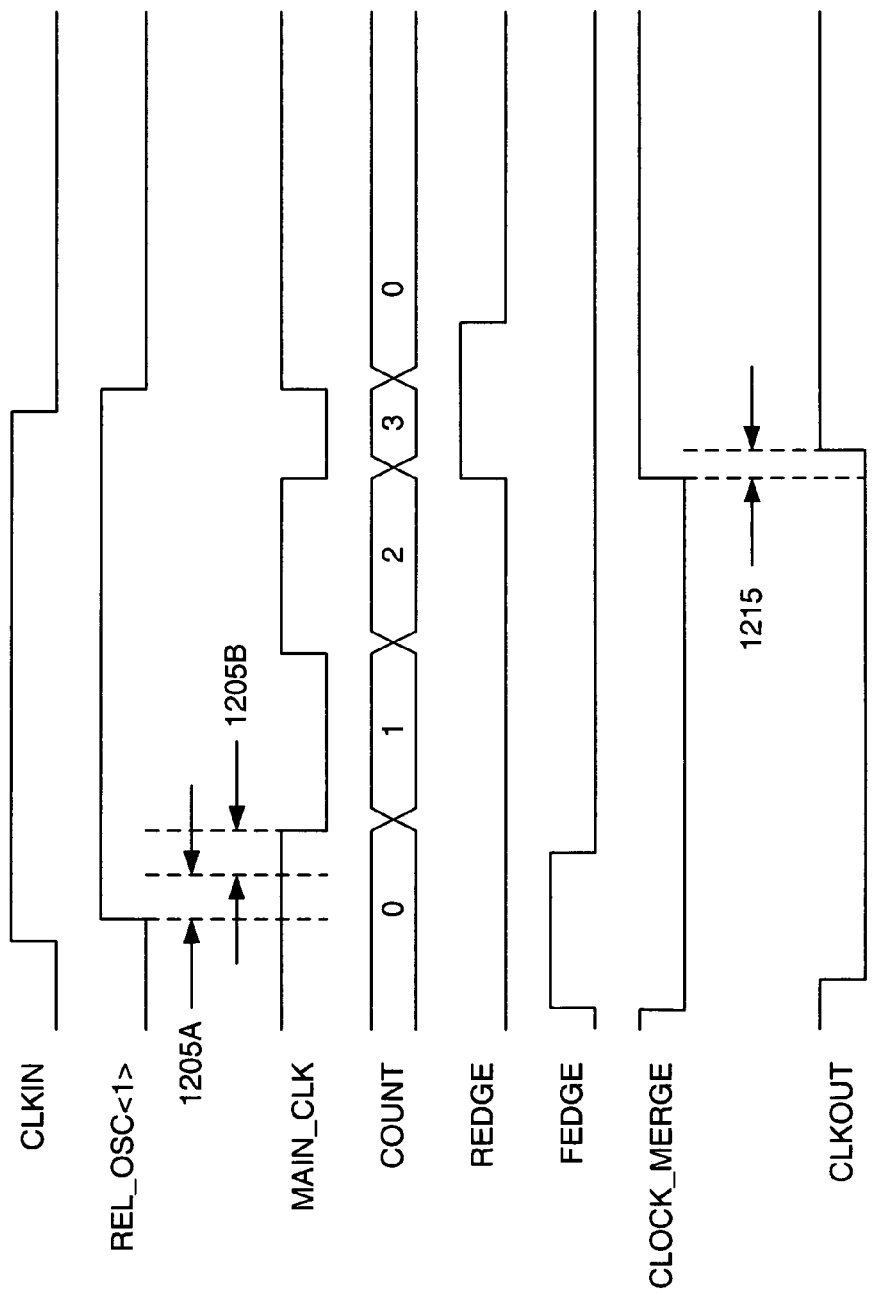
FIG. 12 shows an exemplary timing diagram in accordance with an embodiment of the present invention.

FIG. 12 shows an example timing diagram in accordance with an embodiment of the present invention. As described above, counter-controlled delay line 200 includes three granularities of delay adjustment. A coarse grain adjustment is provided by adjusting the maximum count of the counter, a mid or medium grain adjustment is provided by adjusting the start point of the main oscillator, and a fine grain adjustment is provided by the trim unit. Preferably, the maximum fine grain adjustment is equal to one mid grain adjustment, and the maximum mid grain adjustment is equal to one coarse grain adjustment. This allows for the maximum range of possible delays, and thus the widest frequency range based on a particular organization of the delay select bits. In one embodiment, the fine grain delay step of the trim unit is approximately 23 ps (picoseconds). Thus for a 3-bit fine grain adjustment, the mid grain step would be approximately 8*23=184 ps. In the example shown in FIG. 12, the coarse grain adjustment is 2, the mid grain adjustment is 1, and the fine grain adjustment is 5, thereby corresponding to a DLY-SEL'<15:0> vector of 0000 0000 0100 1101 (i.e., DLY-SEL'<15:5>=00000000010, DLYSEL'<4:3>=01, and DLY-SEL'<2:0>=101).

A rising edge of the input clock CLKIN causes the REL_OSC<1> bit of the release oscillator signal of an edge delay unit to transition to a logic high. This causes the main oscillator to start oscillating with a start point that is delayed by 2 mid trim steps (1205A, 1205B). After the 2 mid trim delay steps, the main oscillator starts to oscillate and provides the main clock signal MAIN_CLK to the counter for generating the coarse grain delay. When the maximum count of 2, corresponding to two coarse grain delay steps, is reached by the counter, it is detected by the comparator and latched by the sampler to produce a pulse at REDGE, corresponding to the delayed rising edge after the coarse and mid grain delay adjustments. A delayed falling edge pulse FEDGE is similarly produced by the other edge delay unit. The pulses from FEDGE and REDGE are combined by the merger circuit to produce a merged clock CLOCK_MERGE. The merged clock CLOCK_MERGE is then trimmed by 5 steps of the fine grain delay (1215) by the trim unit to produce the final output clock CLKOUT.

As described above, the adjustable start point of main oscillator 320 of FIG. 5 is selected by sequential starter circuit 310 using the release signals REL_OSC<3:0> during a reset operation. For example, to select gate element 510D as the start point, REL_OSC<3> is driven to logic low and REL_OSC<0> to REL_OSC<2> are driven to logic high. Then, the active-low reset signal RSTB is asserted to initiate the reset operation, during which sequential starter circuit 310 provides the logic low state of REL_OSC<3> to delay element 510D and provides the logic high states of REL_OSC<0> to REL_OSC<2> to delay elements 510A-510C, respectively. The logic low state of SEL_OSC<3> turns off delay element 510D, drives its positive output (Yp) to logic "0," and drives its negative output (Yn) to logic "1."

The logic high states of SEL_OSC<0> to SEL_OSC<2> turn on corresponding delay elements 510A-510C, thereby allowing the "01" output state of delay element 510D to propagate through the ring oscillator 320 during the reset operation so that the outputs of the other delay elements 510A-510C are set to the "01" initial state. More specifically, the outputs Yp and Yn of gate element 510C transition to logic "0" and "1" after one gate delay, the outputs Yp and Yn of gate element 510B transition to logic "0" and "1" after two gate delays, and the outputs Yp and Yn of gate element 510A transition to logic "0" and "1" after three gate delays. Thus, during reset operations of main oscillator 320 of FIG. 5, up to three gate delays are required for the input signals to all delay elements 510A-510D to settle to the initial states. It is desirable to reduce the number of gate delays required for the input signals to all of the delay elements to settle during reset operations.

Therefore, in accordance with other embodiments of the present invention, a main ring oscillator including a plurality of gated delay elements is configured to receive a single release signal and a plurality of independent load signals, whereby during a reset operation the single release signal may be de-asserted to simultaneously disable all of the gated delay elements, and the output of each gated delay element may be simultaneously driven to any selected logic state in response to a corresponding one of the independent load signals. In this manner, the input signals to all delay elements are able to settle in a single gate delay during reset operations regardless of which delay element is selected as the oscillation start point, as described in detail below. Further, during normal operation, the release signal may be asserted to simultaneously enable all of the gated delay elements, and the load signals may be driven to logic states that allow the output of each gated delay element to be responsive to its input.

Figure 13:
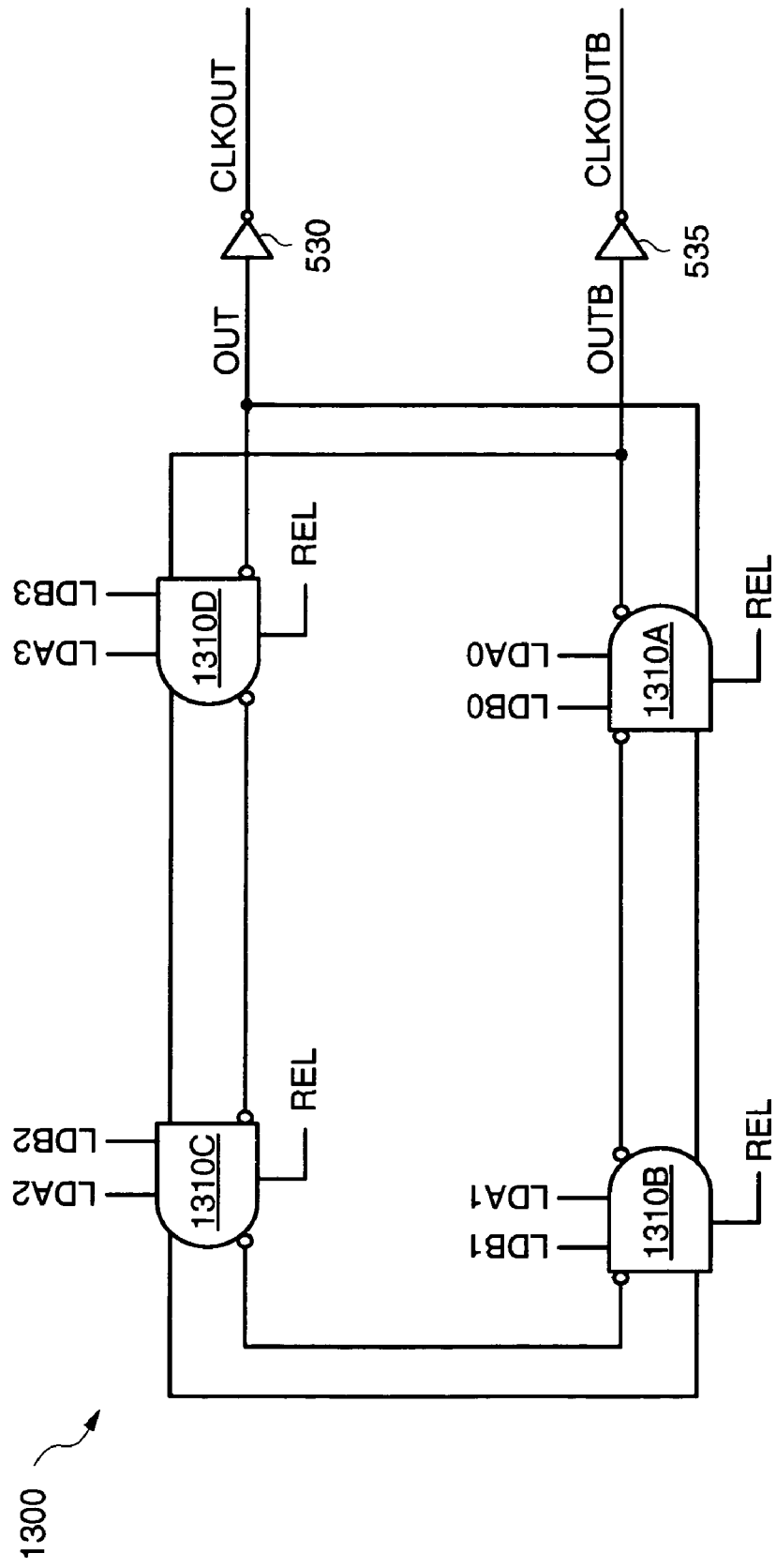
FIG. 13 shows an oscillator in accordance with another embodiment of the present invention.

For example, FIG. 13 shows a four-stage ring oscillator 1300 that is another embodiment of main oscillator 320 of FIG. 3. Ring oscillator 1300 is shown to include four gated delay elements 1310A-1310D connected in a ring, where the delay through any one of the gated delay elements 1310A-1310D is equal to one mid grain delay adjustment step. As shown in FIG. 13, each delay element is a differential NAND gate having a differential input coupled to the differential output of a previous stage. More specifically, the differential output of gated delay element 1310D drives the differential input of gated delay element 1310C, the differential output of gated delay element 1310C drives the differential input of gated delay element 1310B, the differential output of gated delay element 1310B drives the differential input of gated delay element 1310A, and the differential output of gated delay element 1310A drives the differential input of gated delay element 1310D with a reversed polarity, thereby providing the inversion necessary to form a ring oscillator. The differential output of gated delay element 1310A, OUT and OUTB, provides the differential clock output of main oscillator 1300, CLKOUT and CLKOUTB, via gated buffers 530 and 535. For simplicity, the gating signals OFF and OFFB provided to gated buffers 530 and 535, as described above with respect to FIG. 5, are not shown in FIG. 13.

In accordance with the present invention, each gated delay element 1310A-1310D includes a first control terminal to receive the same release signal (REL), and includes a second control terminal to receive a corresponding load signal pair (LDA and LDB). During a reset operation, REL is de-asserted (e.g., to logic "0") to simultaneously turn off all gated delay elements 1310A-1310D to prevent logic transitions therein, and the load signal pairs LDA0-LDB0 to LDA3-LDB3 are used to simultaneously drive the outputs of corresponding delay elements 1310A-1310D to selected independent logic states that collectively select one of the delay elements as the oscillation start point during subsequent normal operation. For example, when driven to a first logic state (e.g., to "10"), a load signal pair LDA-LDB forces the output of the corresponding delay element 1310 to a first differential logic state (e.g., to "01"), and when driven to a second logic state (e.g., to "01"), the load signal pair LDA-LDB forces the output of the corresponding delay element 1310 to a second differential logic state (e.g., to "10"). Thereafter, during the subsequent normal operation, REL is asserted (e.g., to logic "1") to simultaneously turn on all gated delay elements 1310A-1310D, and the load signal pairs are driven to a third state (e.g., to "00") that allows the output of each delay element 1310 to become responsive to the logic signal at its input, thereby allowing main oscillator 1300 to generate an oscillating output clock signal between its outputs OUT and OUTB. As described in more detail below, the ability of main oscillator 1300 to simultaneously drive the outputs of all gated delay elements 1310A-1310D to selected logic states during the reset operation allows the inputs to each delay element to settle in only one gate delay, which is advantageous over the previously-described embodiments of FIG. 5.

Figure 14:
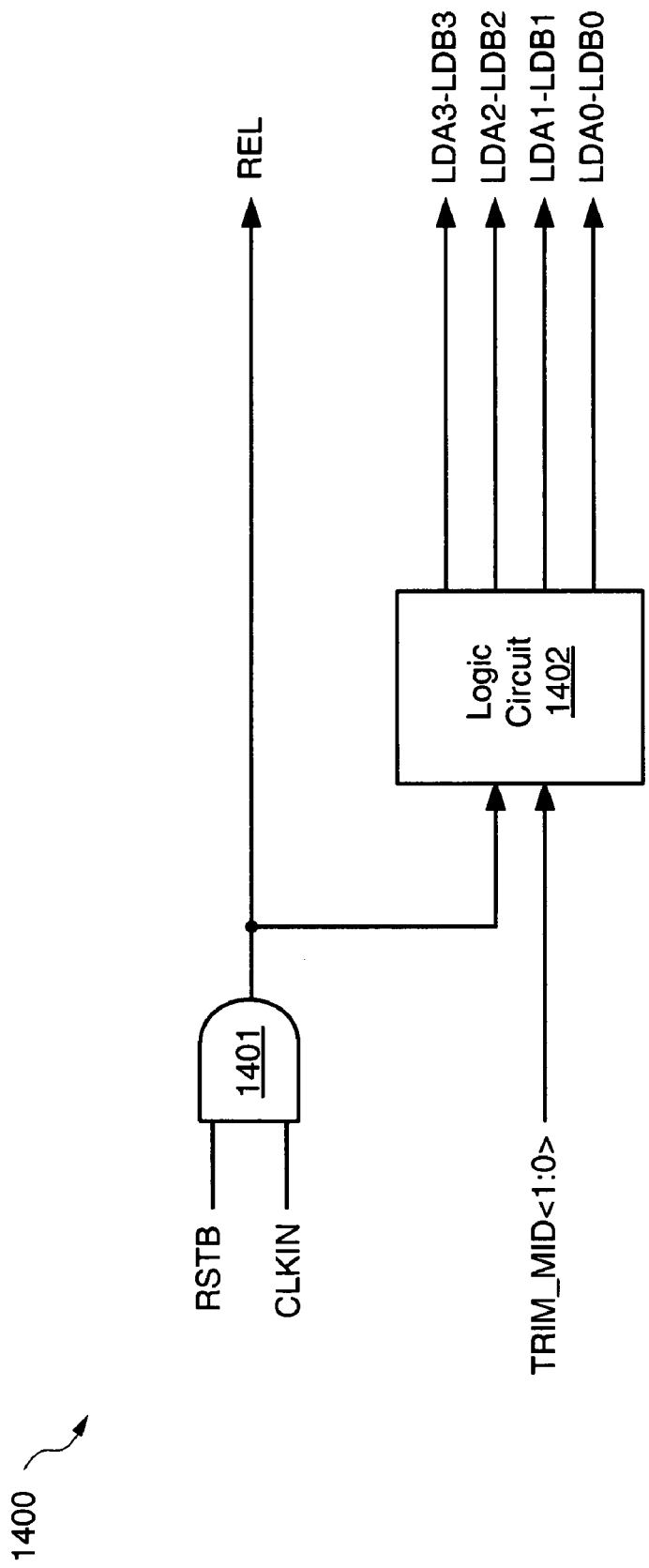
FIG. 14 shows a block diagram of a sequential starter circuit in accordance with another embodiment of the present invention.

The release signal REL and load signal pairs LDA0-LDB0 to LDA3-LDB3 may be generated in any suitable manner. For some embodiments, the active-low reset signal RSTB provided to sequential starter circuit 310 may be used as the release signal REL, and the load signal pairs LDA0-LDB0 to LDA3-LDB3 may be generated in response to a logical combination of REL and the mid trim signals TRIM_MID<1:0> (also see FIG. 4). For example, FIG. 14 shows a starter circuit 1400 that may be used to generate REL and LDA0-LDB0 to LDA3-LDB3 for main oscillator 1300. Starter circuit 1400 includes an AND gate 1401 and a logic circuit 1402. AND gate 1401 includes a first input to receive RSTB, a second input to receive CLKIN, and an output to generate REL. Thus, when RSTB is asserted to logic low, AND gate 1401 forces REL to logic "0," which in turn simultaneously disables all gated delay elements 1310A-1310D to stop oscillation of circuit 1300. Conversely, when RSTB is de-asserted to logic high, CLKIN is propagated through AND gate 1401 as REL, the first logic high state of which will simultaneously enable all gated delay elements 1310A-1310D to allow oscillations in circuit 1300.

Logic circuit 1402 includes a first input to receive REL, a second input to receive TRIM_MID<1:0>, and four outputs to generate load signal pairs LDA0-LDB0 to LDA3-LDB3. Logic circuit 1402 may employ any suitable combinational logic that generates load signal pairs LDA0-LDB0 to LDA3-LDB3 in response to REL and TRIM_MID<1:0> according to the logic functions summarized below in Table 1, where "x" is a don't care. Because many different circuit configurations may be utilized by those skilled in the art to produce the logic functions summarized in Table 1, specific circuit-level embodiments of logic circuit 1402 are not described herein for brevity. Table 1 also indicates which of the gated delay elements 1310-1310D is selected as the oscillation start point in response to the load signal pairs LD0-LD3.

TABLE 1

| REL | TRIM_MID | LDA0/ LDB0 | LDA1/ LDB1 | LDA2/ LDB2 | LDA3/ LDB3 | Start point |
|---|---|---|---|---|---|---|
| 0 | 00 | 10 | 01 | 01 | 01 | 1310A |
| 0 | 01 | 10 | 10 | 01 | 01 | 1310B |
| 0 | 10 | 10 | 10 | 10 | 01 | 1310C |

TABLE 1-continued

| REL | TRIM_MID | LDA0/ LDB0 | LDA1/ LDB1 | LDA2/ LDB2 | LDA3/ LDB3 | Start point |
|---|---|---|---|---|---|---|
| 0 | 11 | 10 | 10 | 10 | 10 | 1310D |
| 1 | x | 00 | 00 | 00 | 00 | n/a |

Figure 15:
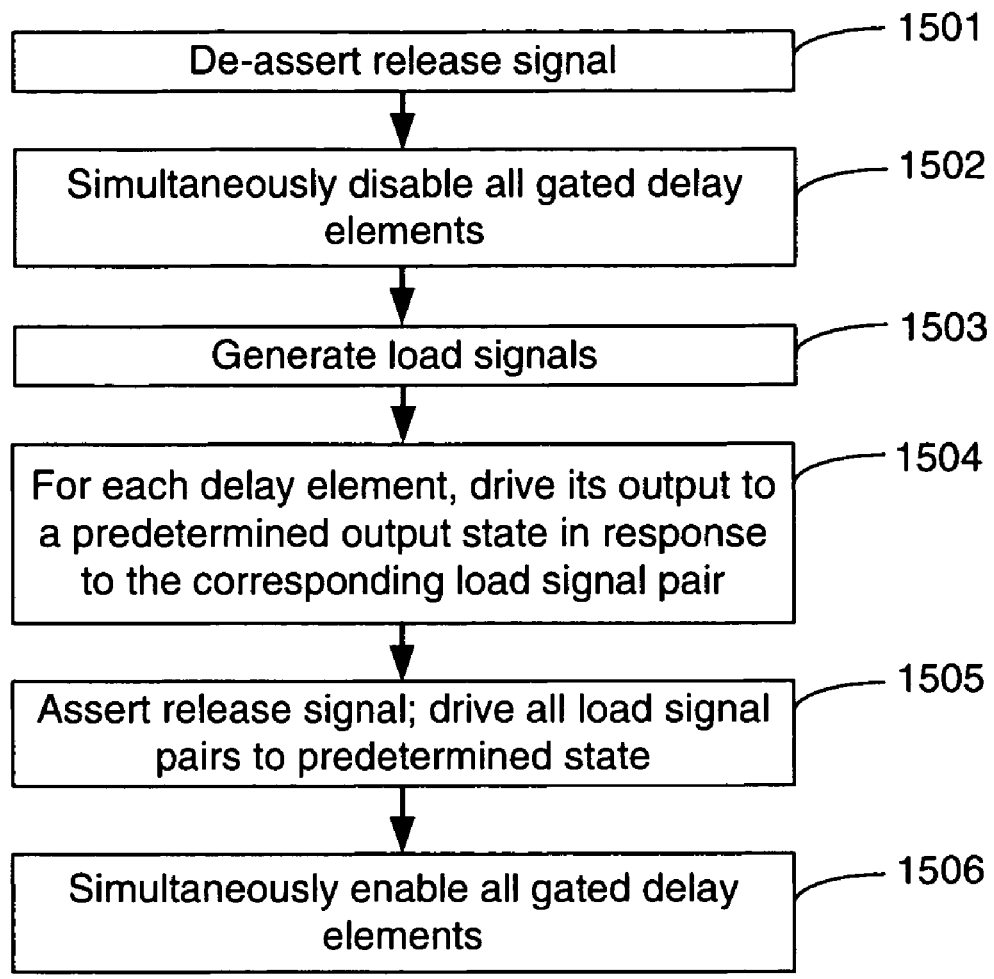
FIG. 15 shows a flow chart depicting operation of an exemplary embodiment of the oscillator of FIG. 13.

An exemplary operation of main oscillator 1300 is described below with reference being made to the flow chart of FIG. 15 and the illustrative state diagrams of FIGS. 16A-16F and FIGS. 17A-17D. Initially, RSTB is asserted to logic low, and in response thereto starter circuit 1400, which is in its reset state, de-asserts REL (e.g., to logic "0") (step 1501). The de-asserted state of REL simultaneously disables all gated delay elements 1310A-1310D, thereby preventing the gated delay elements from driving their outputs in response to their inputs (step 1502). Then, suitable values of the load signal pairs LDA0-LDB0 to LDA3-LDB3 are generated to select one of the gated delay elements as the oscillation start point for subsequent normal operation of main oscillator 1300 (step 1503). In response thereto, each gated delay element 1310A-1310D drives its output to a logic state indicated by the corresponding load signal pair (step 1504). For some embodiments, the gated delay elements simultaneously drive their outputs to the logic states indicated by the independent load signals.

Figure 16A:
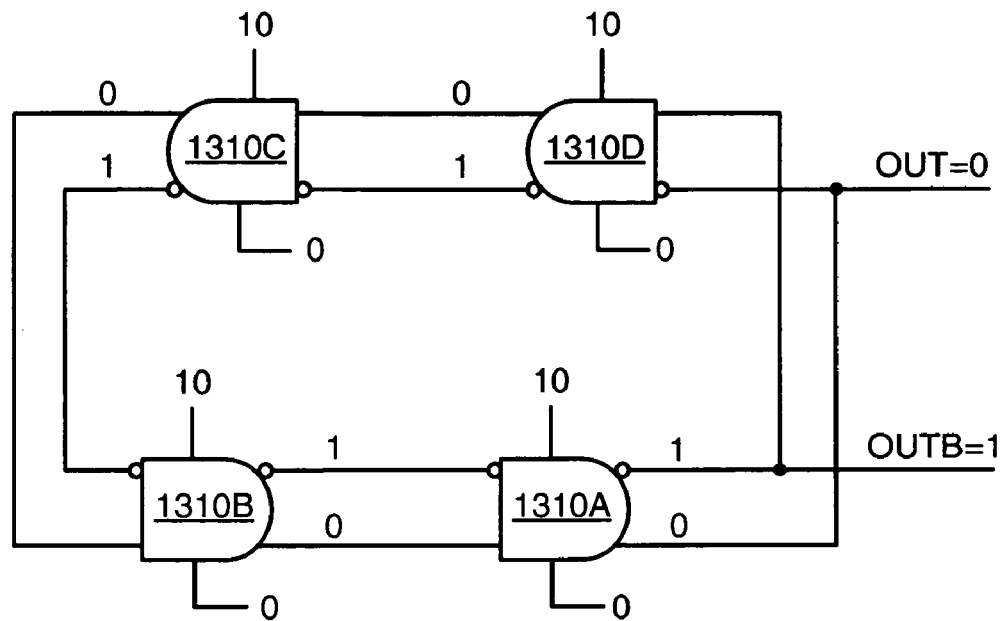
FIGS. 16A-16F depict various oscillation states for a first exemplary operation of the oscillator of FIG. 13.

For a first example, to select gated delay element 1310D as the start point, TRIM_MID<1:0> is driven to a "11" state. In response to the logic "11" state of TRIM_MID<1:0> (and the logic "0" state of REL), logic circuit 1402 drives all load signal pairs LDA0-LDB0 to LDA3-LDB3 to logic state "10," as indicated above in Table 1. More specifically, the logic "10" state of LDA3-LDB3 sets the positive and negative outputs of gated delay element 1310D to logic "0" and logic "1," respectively, the logic "10" state of LDA2-LDB2 sets the positive and negative outputs of gated delay element 1310C to logic "0" and logic "1," respectively, the logic "10" state of LDA1-LDB1 sets the positive and negative outputs of gated delay element 1310B to logic "0" and logic "1," respectively, and the logic "10" state of LDA0-LDB0 sets the positive and negative outputs of gated delay element 1310A to logic "0" and logic "1," respectively, as depicted in FIG. 16A.

Figure 17A:
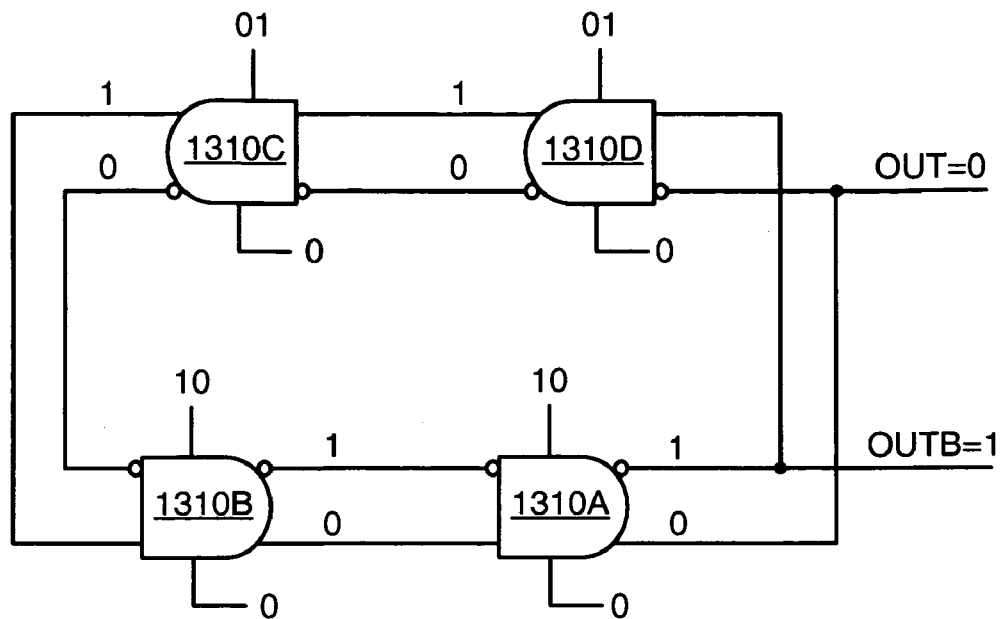
FIGS. 17A-17D depict various oscillation states for a second exemplary operation of the oscillator of FIG. 13.

For a second example, to select gated delay element 1310B as the start point, TRIM_MID<1:0> is driven to a "01" state. In response to the logic "01" state of TRIM_MID<1:0> (and the logic "0" state of REL), logic circuit 1402 drives load signal pairs LDA0-LDB0 and LDA1-LDB1 to logic state "10" and drives load signal pairs LDA2-LDB2 and LDA3-LDB3 to logic state "01," as indicated above in Table 1. More specifically, the logic state "01" of LDA3-LDB3 sets the positive and negative outputs of gated delay element 1310D to logic "1" and logic "0," respectively, the logic state "01" of LDA2-LDB2 sets the positive and negative outputs of gated delay element 1310C to logic "1" and logic "0," respectively, the logic state "10" of LDA1-LDB1 sets the positive and negative outputs of gated delay element 1310B to logic "0" and logic "1," respectively, and the logic "10" state of LDA0-LDB0 sets the positive and negative outputs of gated delay element 1310A to logic "0" and logic "1," respectively, as depicted in FIG. 17A.

To initiate oscillation in main oscillator 1300, RSTB is de-asserted to logic high, and in response thereto starter circuit 1400 asserts REL (e.g., to logic "1") in response to the first rising edge of CLKIN and drives all load signal pairs to the predetermined logic state "00" (step 1505). The asserted state of REL simultaneously enables all gated delay elements 1310A-1310D, and the predetermined logic state "00" of each load signal pair allows the corresponding delay element to drive its output in response to the differential signal at its inputs, thereby allowing the main oscillator 1300 to begin oscillating at the selected stage (step 1506).

Figure 16B:
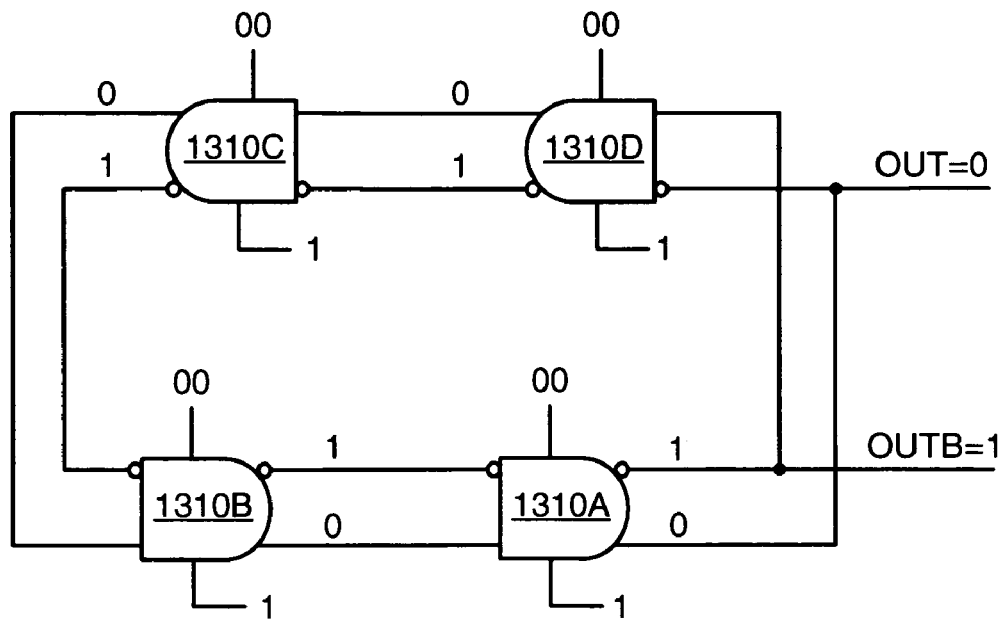
Figure 16C:
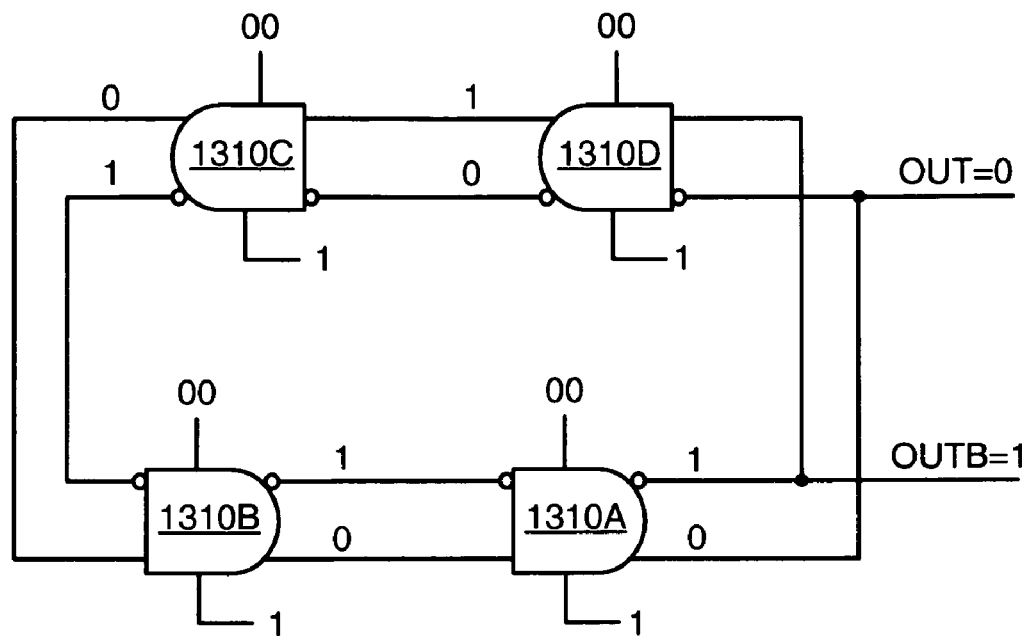
Figure 16D:
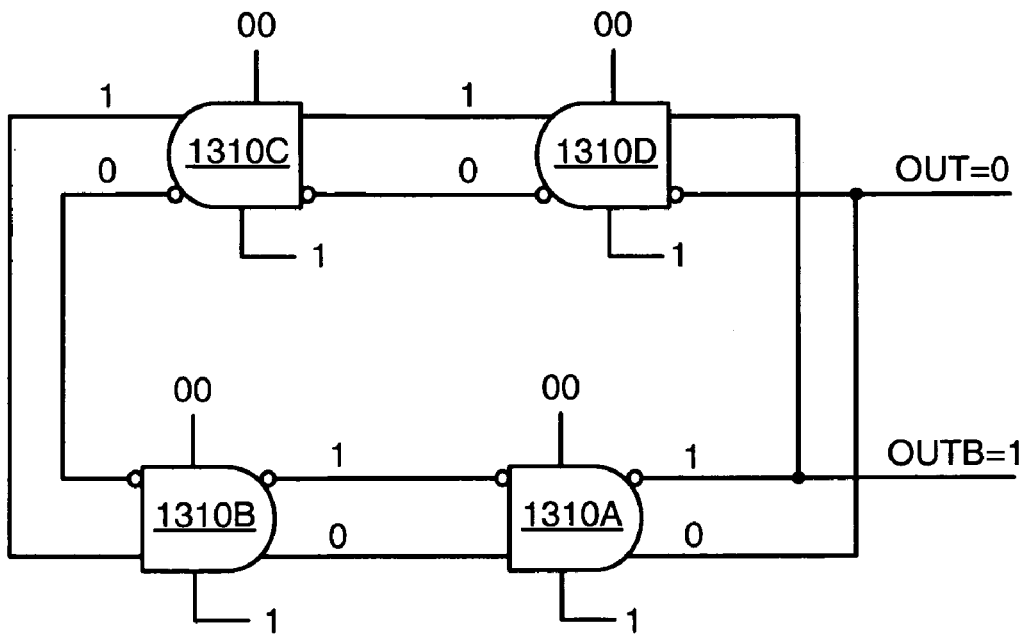
Figure 16E:
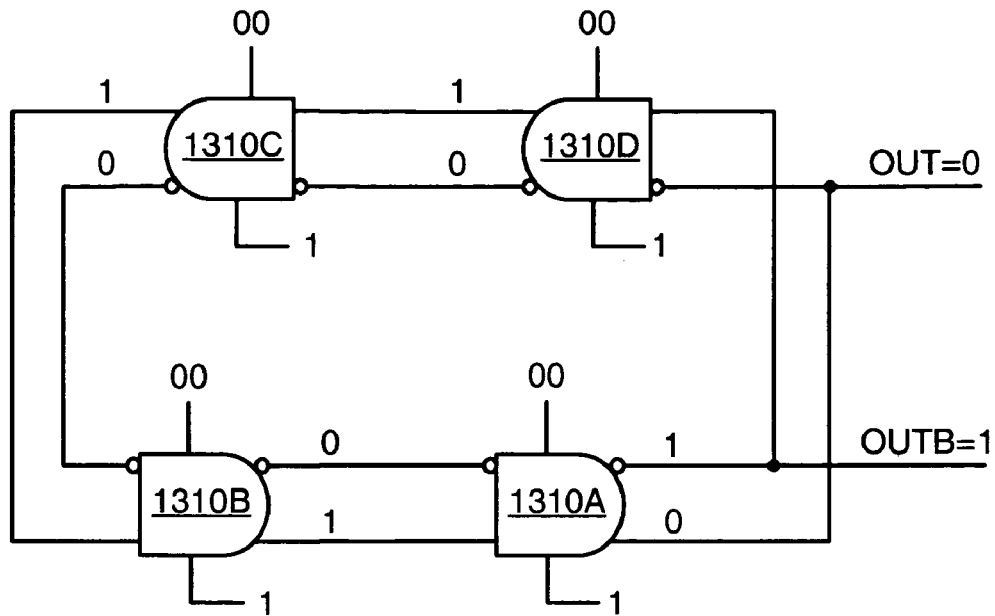
Figure 16F:
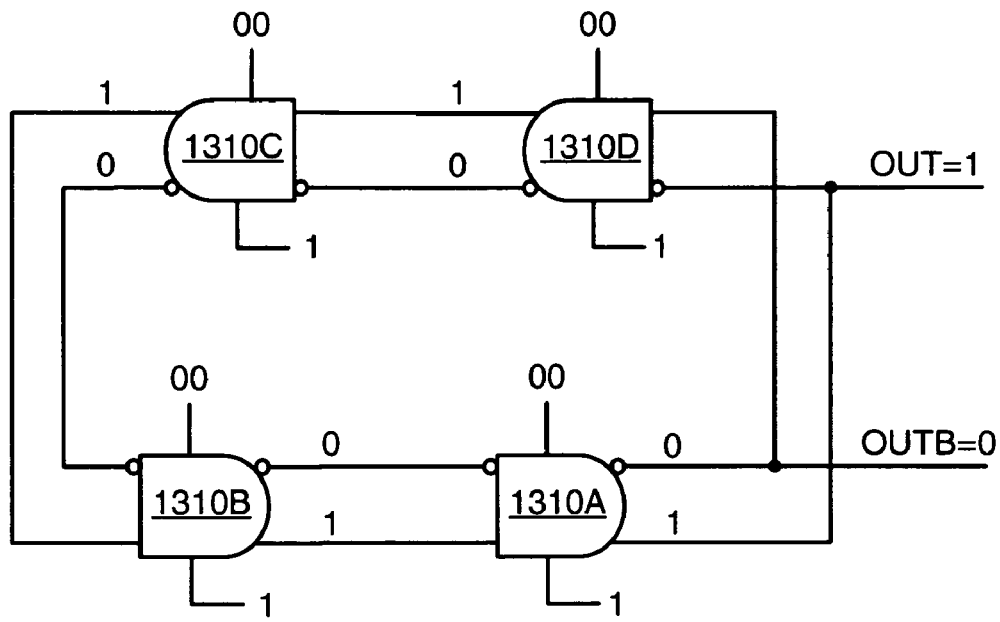

Thus, for the first example described above, when REL is asserted to "1" and all load signal pairs are driven to "00," which allow the gated delay elements 1310 to drive their outputs in response to their inputs, the positive outputs of all gated delay elements 1310A-1310D are initially logic "0" and the negative outputs of all gated delay elements 1310A-1310D are initially logic "1," as depicted in FIG. 16B. Then, one gate delay after REL is asserted, the logic "10" differential signal between the positive and negative inputs of delay element 1310D propagates through delay element 1310D to drive the differential output of delay element 1310D from logic "01" to logic "10," as depicted in FIG. 16C. Two gates delays after REL is asserted, the logic "10" differential signal between the positive and negative inputs of delay element 1310C propagates through delay element 1310C to drive the differential output of delay element 1310C from logic "01," to logic "10," as depicted in FIG. 16D. Three gate delays after REL is asserted, the logic "10" differential signal between the positive and negative inputs of delay element 1310B propagates through delay element 1310B to drive the differential output of delay element 1310B from logic "01" to logic "10," as depicted in FIG. 16E. Four gate delays after REL is asserted, the logic "10" differential signal between the positive and negative inputs of delay element 1310A propagates through delay element 1310A to drive the differential output of delay element 1310A from logic "01" to logic "10," which in turn transitions the output signal from "01" to "10," as depicted in FIG. 16F. Thus, by selecting delay element 1310D as the start point, the output signal transitions logic states four gate delays after REL is asserted. In this manner, a phase offset equal to the delay through four delay elements 1310 precedes the first transition of the output clock. Similarly, phase offsets equal to 3, 2, and 1 times the delay through a gated delay element 1310 are provided when gated delay element 1310C, 1310B, and 1310A, respectively, is selected as the oscillation start point.

Figure 17B:
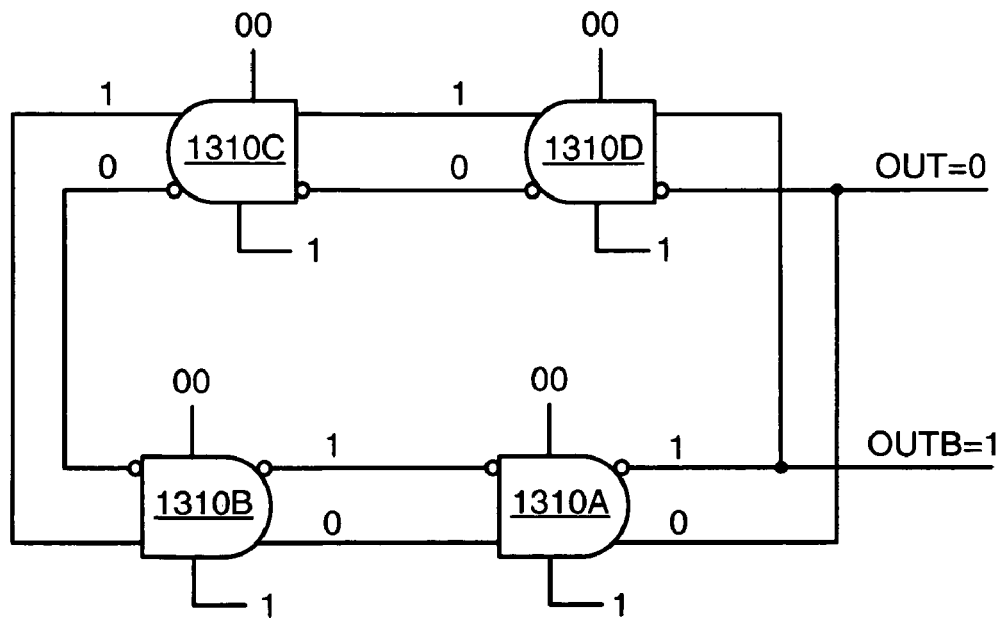
Figure 17C:
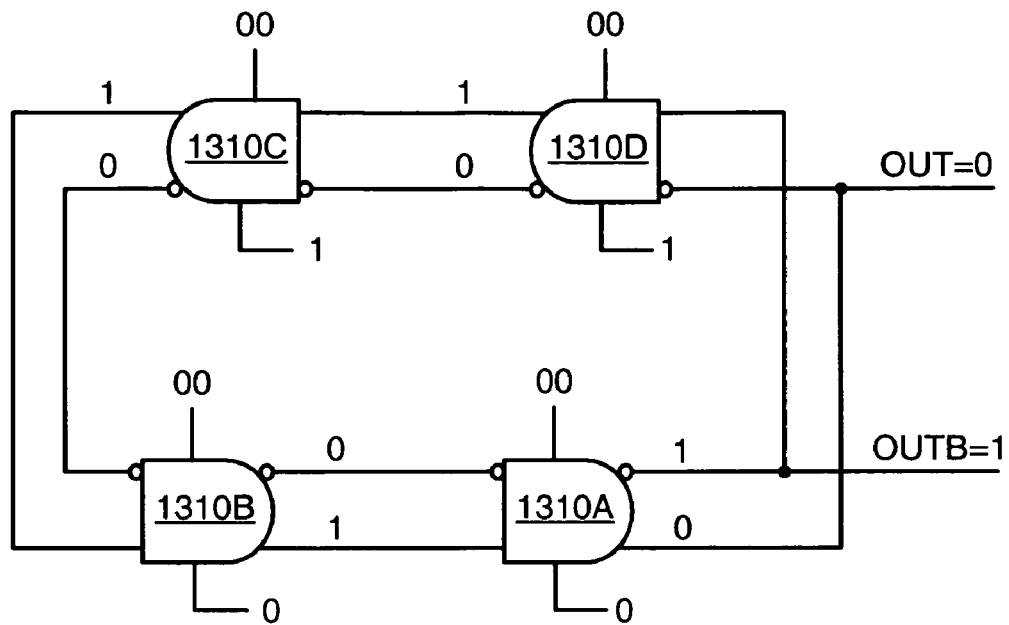
Figure 17D:
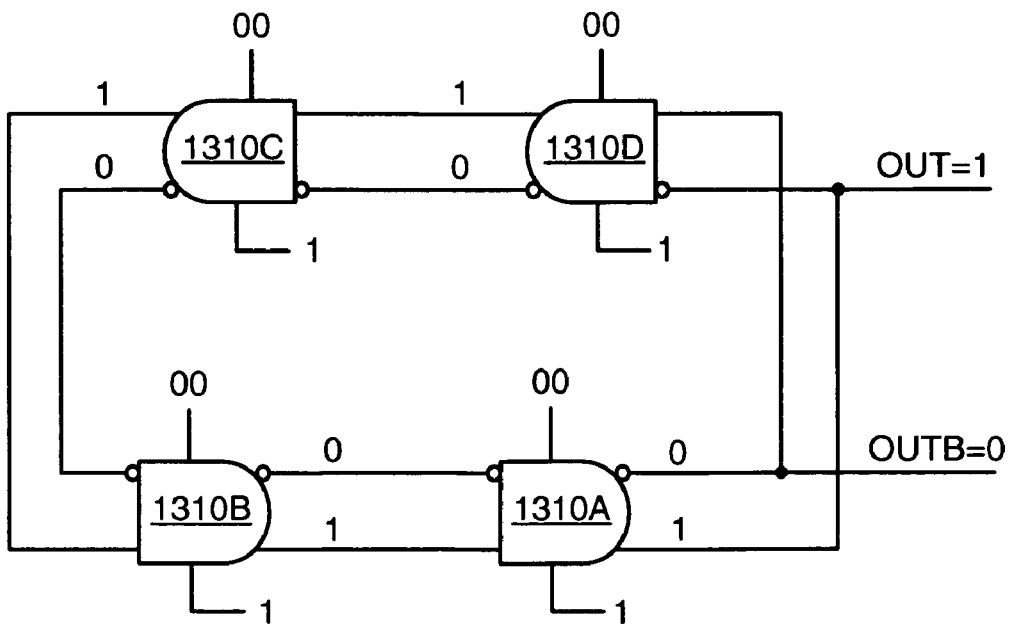

Thus, for the second example described above, when REL is asserted to "1" and all load signal pairs are driven to "00," which allow the gated delay elements 1310 to drive their outputs in response to their inputs, the differential outputs of gated delay elements 1310A-1310B are set to logic "01" and the differential outputs of gated delay elements 1310C-1310D are set to logic "10," as depicted in FIG. 17B. Then, one gate delay after REL is asserted, the logic "10" differential signal between the positive and negative inputs of delay element 1310B propagates through delay element 1310B to drive the differential output of delay element 1310B from logic "01," to logic "10," as depicted in FIG. 16C. Two gates delays after REL is asserted, the logic "10" differential signal between the positive and negative inputs of delay element 1310A propagates through delay element 1310A to drive the differential output of delay element 1310A from logic "01" to logic "10," which in turn transitions the output signal from "01" to "10," as depicted in FIG. 16D.

During normal operation of main oscillator 1300, if it is desired to adjust the phase offset between the output clock and CLKIN, the main oscillator 1300 may be stopped by de-asserting REL to logic "0" and driving the load signal pairs LDA0-LDB0 to LDA3-LDB3 to suitable logic states that select a desired one of gated delay elements 1310A-1310D as the new oscillation start point. Because de-assertion of REL to logic "0" simultaneously disables all delay elements 1310A-1310D so that the load signal pairs may drive each of their corresponding outputs to any selected logic states at the same time, oscillator 1300 requires only one gate delay for all of the internal logic signals (e.g., the input signals to all delay elements 1310A-1310D) to settle to their desired states. In contrast, because the oscillator 500 of FIG. 5 disables only a selected one of its delay elements 510 and drives only the outputs of the selected delay element to a predetermined logic state during reset operations, the predetermined output logic state of the selected delay element requires 3 gate delays to propagate through the ring oscillator. The ability of oscillator 1300 to drive the outputs of all its gated delay elements 1310 to selected logic states within one gate delay is advantageous for several reasons.

First, reducing the settling time of the main oscillator during reset operations allows the oscillator to more quickly begin normal operation after the oscillation start point is adjusted during the reset operation, which is desirable by users. Further, for embodiments in which oscillator 1300 may be used to phase-shift the input clock signal CLKIN to generate the output clock signal CLKOUT, reducing the settling time of oscillator 1300 (e.g., as compared to oscillator 500) allows the rising edges of CLKOUT to occur more immediately before subsequent rising edges of CLKIN without circuit failure, thereby advantageously increasing the amount by which CLKIN can be shifted to generate CLKOUT.

Second, because the specific delay of gated delay elements 1310 of similarly-designed oscillators 1300 may differ between devices due to process variations inherent in the fabrication of semiconductor devices, a manufacturer must typically specific a larger than desired settle time to ensure that all oscillators fabricated using a particular process technology meet the specified settle time. Indeed, because testing each oscillator to determine whether it meets the specified settle time is a time-consuming and cost-prohibitive process, the specified settle time typically includes a tolerance amount that accounts for variations in actual settle times, which undesirably results in the specified settle time being greater than the actual settle time for most oscillators fabricated using the given process. Thus, by reducing the oscillator's settle time from three gate delays to one gate delay, embodiments of the present invention allow a manufacturer to specify a settling time that is not only lower than it would be for oscillator 500, but also more accurate (e.g., includes less tolerance) than it would be for oscillator 500 because the timing variations associated with one gate delay are less than the timing variations associated with three gate delays.

In addition, when the release signal REL to oscillator 1300 is asserted to release the oscillator from the reset operation, the output signal of the delay element 1310 selected as the start point by load signal pairs LDA0-LDB0 to LDA3-LDB3 begins to propagate through the ring oscillator in the same manner as that of oscillator 500 of FIG. 5, thereby preserving the symmetric nature of the oscillator.

Figure 18:
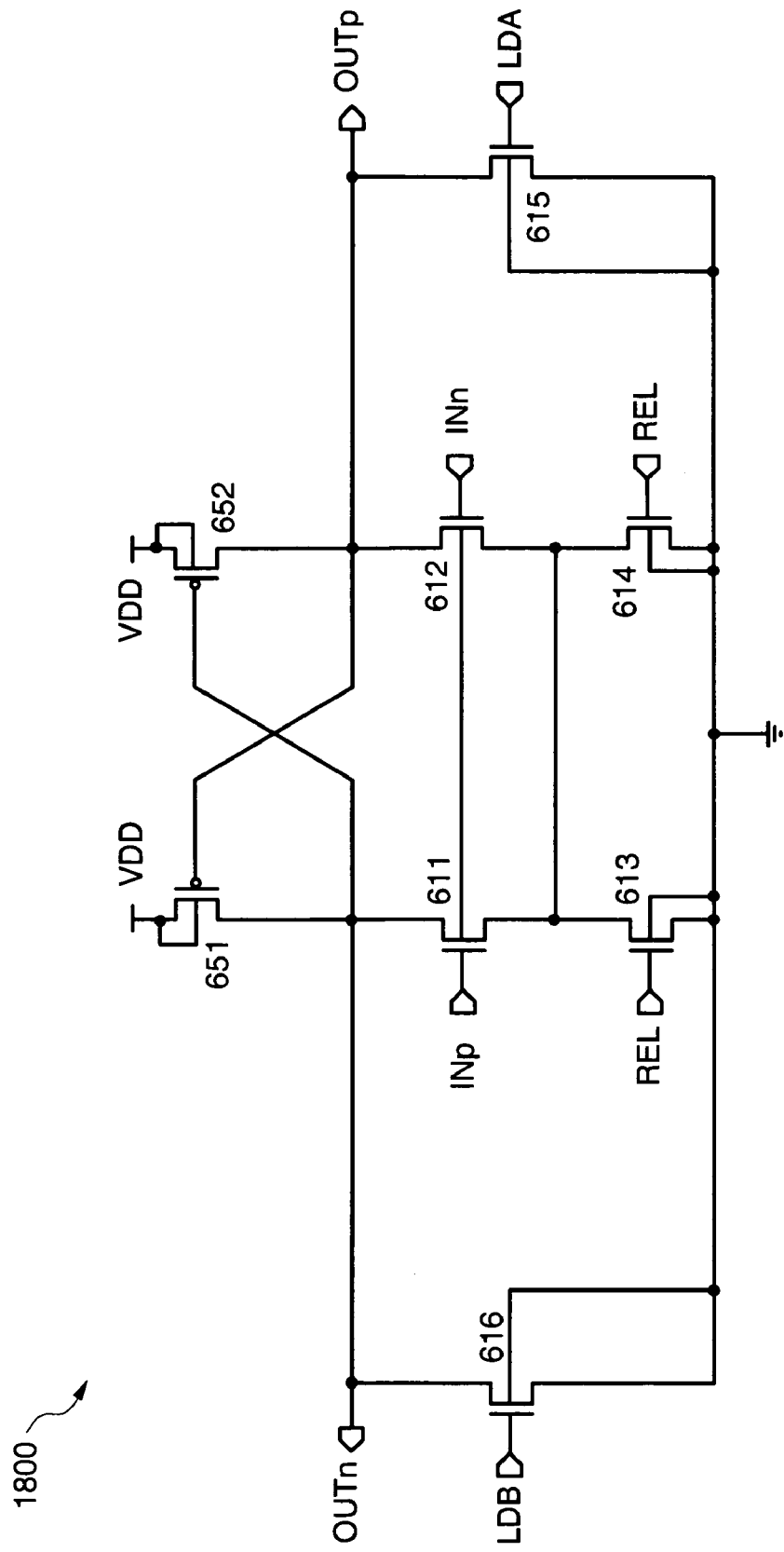
FIG. 18 shows a circuit diagram of delay element in accordance with another embodiment of the present invention.

FIG. 18 shows an embodiment of a gated delay element 1800 that is one embodiment of gated delay element 1310 of main oscillator 1300 of FIG. 13. Delay element 1800 is similar to and includes all the functional elements of delay element 510 of FIG. 6, except that the gates of transistors 613-614 of delay element 1800 are responsive to REL, the gate of transistor 615 of delay element 1800 is responsive to a corresponding first load signal LDA, and the gate of transistor 616 of delay element 1800 is responsive to a corresponding second load signal LDB. As described above, the differential nature of delay elements such as gated delay element 1800 allows the output clock to have symmetric rise and fall times, thereby minimizing duty cycle distortion and other timing errors.

An exemplary operation of delay element 1800 is as follows. Referring to both FIGS. 13 and 18, when the oscillator 1300 is stopped to select an oscillation starting point, REL is de-asserted to logic low, and the load signals LDA and LDB are driven to opposite logic states (e.g., either LDA=0 and LDB=1 or LDA=1 and LDB=0). The logic low state of REL turns off NMOS transistors 613-614 to prevent the input signals INp and INn from pulling OUTn and OUTP to ground potential via NMOS pull-down transistors 611 and 612, respectively, thereby preventing the differential input signal between INp and INn from affecting the logic state of the differential output signal between OUTp and OUTn. With NMOS transistors 613 and 614 turned off, the load signals LDA and LDB may be used to set the output signals OUTp and OUTn to any desired logic states. For example, if LDA=0 and LDB=1 NMOS transistor 615 turns off and NMOS transistor 616 turns on. In response thereto, transistor 616 pulls OUTn low to ground potential, which turns on PMOS transistor 652 to pull OUTp high toward VDD. In this state, the differential output signal between OUTp and OUTn is forced to a logic "1" value. Conversely, if LDA=1 and LDB=0, NMOS transistor 615 turns on and NMOS transistor 616 turns off. In response thereto, transistor 615 pulls OUTp low to ground potential, which turns on PMOS transistor 651 to pull OUTn high toward VDD. In this state, the differential output signal between OUTp and OUTn is forced to a logic "0" value.

When the oscillator 1300 is released to initiate oscillation of the output clock signal, REL is asserted to logic "1," and the load signals LDA and LDB are both driven to logic "0" (e.g., LDA=LDB=0). The logic low states of LDA and LDB turn off respective NMOS transistors 615 and 616, and the logic high state of REL turns on transistors 613-614, thereby allowing the input signals INp and INn to drive output signals OUTp and OUTn to corresponding logic states. For example, if INp=0 and INn=1, NMOS transistor 611 turns off and NMOS transistor 612 turns on. In response thereto, transistors 612 and 614 pull OUTp low to ground potential, which turns on PMOS transistor 651 to pull OUTn high toward VDD. In this state, the differential "0" input signal between INp and INn propagates through delay element 1800 as a logic "0" differential output signal between OUTP and OUTn. Conversely, if INp=1 and INn=0, NMOS transistor 611 turns on and NMOS transistor 612 turns off. In response thereto, transistors 611 and 613 pull OUTn low to ground potential, which turns on PMOS transistor 652 to pull OUTP high toward VDD. In this state, the differential "1" input signal between INp and INn propagates through delay element 1800 as a logic "1" differential output signal between OUTP and OUTn.

As mentioned above, process variations inherent in the fabrication of semiconductor devices often cause circuits having the same design to behave differently. For example, limitations of present photolithography techniques often result in transistors of the same design having different gate lengths, which typically leads to variations in transistor operating characteristics. Further, as process technologies continually move to smaller geometry devices, these process variations become even more pronounced. More specifically, while the differential operation of PMOS transistors 651-652 of delay element 1800 may adequately compensate for device mismatch for process geometries greater than 100 nm, for process geometries less than 100 nm, the differential nature of delay element 1800 may no longer sufficiently compensate for device mismatch, which in turn may undesirably increase jitter.

Although increasing the width of the PMOS transistors 651-652 (e.g., and thus their drive strength) may improve device mismatch, transistor performance may be adversely affected in some process variation corners when the transistor width is increased. For example, in the fast-PMOS, slow-NMOS process corner, increasing the transistor width of PMOS pull-up transistors 651-652 may cause those transistors to be too fast (e.g., as compared to NMOS transistors 611-615) for the gated delay element to operation properly. Thus, in accordance with the present invention, the width of PMOS transistors 651-652 may be increased to minimize mismatch between gated delay elements 1800, and the length of PMOS transistors 651-652 may be increased to reduce the drive strength of the PMOS transistors so that devices in the fast-PMOS, slow NMOS process corner operate properly.

Those having ordinary skill in the relevant arts of the invention will now perceive various modifications and additions that can be made as a result of the disclosure herein. For example, although certain circuits are described above as differential circuits, single-ended circuits having the same or similar functions may be substituted for those circuits. In addition, although the exemplary embodiments described with respect to FIGS. 13-18 are shown to include four gated delay elements 1310, for other embodiments, oscillators of the present invention may include other numbers of gated delay elements 1310.

Furthermore, capacitors, transistors, logic gates, and other components other than those described herein may be used to implement the invention. Active-high signals can be replaced with active-low signals by making straightforward alterations to the circuitry, such as are well known in the art of circuit design. Logic circuits can be replaced by their logical equivalents, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of ordinary skill in the art.

Accordingly, all such modifications and additions are deemed to be within the scope of the invention, which is defined only by the appended claims and their equivalents.

What is claimed is:

1. A ring oscillator for generating a clock signal and having a plurality of stages and an adjustable start point, the ring oscillator comprising:
    a release signal;
    a plurality of independent load signals, each independent load signal comprising a binary signal setting an output of a corresponding stage to a logic value to establish the adjustable start point at an output of a predetermined stage of the plurality of stages; and
    a plurality of gated delay elements, each comprising:
        a signal input coupled to a signal output of a previous gated delay element;
        a signal output coupled to the signal input of a next gated delay element;
        a first control terminal to receive a corresponding independent load signal;
    and
        a second control terminal to receive the release signal.

2. The ring oscillator of claim 1, wherein the independent load signals collectively select one of the gated delay elements as the adjustable start point.

3. The ring oscillator of claim 2, wherein each independent load signal independently drives the signal output of a corresponding gated delay element to any logic state.

4. The ring oscillator of claim 1, wherein assertion of the release signal simultaneously enables all of the gated delay elements to transition logic states.

5. The ring oscillator of claim 1, wherein de-assertion of the release signal simultaneously prevents logic state transitions in all of the gated delay elements.

6. The ring oscillator of claim 5, wherein the independent load signals simultaneously drive the signal outputs of the gated delay elements to different logic states.

7. The ring oscillator of claim 1, wherein:
each gated delay element comprises a differential gated delay element;
each signal input of the gated delay elements comprises a positive input and a negative input;
each signal output of the gated delay elements comprises a positive output and a negative output; and
each of the independent load signals comprises a first load signal and a second load signal.

8. The ring oscillator of claim 7, wherein upon a de-assertion of the release signal, the positive outputs of the differential gated delay elements are simultaneously driven to selected logic states in response to corresponding ones of the first load signals, and the negative outputs of the differential gated delay elements are simultaneously driven to complemented logic states in response to corresponding ones of the second load signals.

9. The ring oscillator of claim 7, wherein the differential gated delay element comprises:
a first PMOS transistor coupled between a supply voltage and the negative output;
a second PMOS transistor coupled between the supply voltage and the positive output;
first and second NMOS transistors connected in series between the negative output and ground potential, the first NMOS transistor having a gate coupled to the positive input, and the second NMOS transistor having a gate to receive the release signal;
third and fourth NMOS transistors connected in series between the positive output and ground potential, the third NMOS transistor having a gate coupled to the negative input, and the fourth NMOS transistor having a gate to receive the release signal;
a fifth NMOS transistor connected in series between the negative output and ground potential, the fifth NMOS transistor having a gate to receive the first load signal; and
a sixth NMOS transistor connected in series between the positive output and ground potential, the sixth NMOS transistor having a gate to receive the second load signal.

10. The ring oscillator of claim 1, further comprising a clock output, the clock output of the ring oscillator coupled to a counter in a counter-controlled delay line.

11. A ring oscillator for generating a clock signal and having a plurality of stages and an adjustable starting point, the ring oscillator comprising:
a plurality of gated delay elements, each having an output of a corresponding stage of the plurality of stages, coupled together to form a ring;
means for simultaneously preventing logic state transitions in all of the gated delay elements;
means for simultaneously driving the output of each gated delay element to a corresponding independently selected logic state in response to a Plurality of binary load signals; and
means for selecting one of the gated delay elements as the adjustable start point for the ring oscillator based upon the binary load signals.

12. The ring oscillator of claim 11, wherein the means for simultaneously preventing is responsive to a single release signal.

13. The ring oscillator of claim 11, wherein the selected logic states are determined by the binary load signals.

14. A method of operating a ring oscillator including a plurality of gated delay elements coupled together in a ring, each gated delay element having an output, the method comprising:
generating a single release signal;
de-asserting the single release signal;
simultaneously disabling all of the gated delay elements in response to the de-asserting;
generating a plurality of load signals, each load signal comprising a binary signal setting an output of a corresponding gated delay element to a predetermined logic value;
for each gated delay element, simultaneously driving the output to a selected logic state in response to a corresponding load signal; and
selecting a start point in the ring oscillator in response to the plurality of load signals.

15. The method of claim 14, wherein the selected logic states associated with the gated delay elements are independent of each other.

16. The method of claim 14, further comprising:
asserting the single release signal; and
simultaneously enabling all of the gated delay elements in response to the asserting.

17. The method of claim 14, wherein each load signal comprises a signal pair.

* * * * *